US009863808B2

(12) United States Patent
Saito et al.

(10) Patent No.: US 9,863,808 B2
(45) Date of Patent: Jan. 9, 2018

(54) OUTPUT-CURRENT DETECTION CHIP FOR DIODE SENSORS, AND DIODE SENSOR DEVICE

(71) Applicant: ASAHI KASEI MICRODEVICES CORPORATION, Tokyo (JP)

(72) Inventors: Tetsuya Saito, Tokyo (JP); Kensaku Wada, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 15/110,177

(22) PCT Filed: Jan. 7, 2015

(86) PCT No.: PCT/JP2015/000040
§ 371 (c)(1),
(2) Date: Jul. 7, 2016

(87) PCT Pub. No.: WO2015/105048
PCT Pub. Date: Jul. 16, 2015

(65) Prior Publication Data
US 2016/0334272 A1    Nov. 17, 2016

(30) Foreign Application Priority Data

Jan. 8, 2014   (JP) ................. 2014-001796
Mar. 19, 2014  (JP) ................. 2014-056294

(51) Int. Cl.
  *G01J 1/44*   (2006.01)
  *H01L 31/103* (2006.01)
  (Continued)

(52) U.S. Cl.
  CPC ............ *G01J 1/44* (2013.01); *H01L 27/0248* (2013.01); *H01L 31/02019* (2013.01); *H01L 31/103* (2013.01); *G01J 2001/446* (2013.01)

(58) Field of Classification Search
  CPC ... G01J 1/44; G01J 2001/446; H01L 27/0248; H01L 31/02019; H01L 31/103
  (Continued)

(56) References Cited

U.S. PATENT DOCUMENTS 6,002,355 A * 12/1999 Del Signore ........... H03M 1/12
                                                  327/534
6,326,620 B1 * 12/2001 Willis ....................... G01J 5/14
                                                  250/338.1

(Continued)

FOREIGN PATENT DOCUMENTS

JP    H04-326008 A    11/1992
JP    H09-105671 A     4/1997

(Continued)

OTHER PUBLICATIONS

International Search Report dated Apr. 7, 2015 for International Patent Application No. PCT/JP2015/000040.

(Continued)

*Primary Examiner* — Brandon S Cole
(74) *Attorney, Agent, or Firm* — Morgan, Lewis & Bockius LLP

(57) ABSTRACT

The present invention relates to an output-current detection IC chip for diode sensors and a diode sensor device, which reduce the influence by a leak current of a protection circuit. The present invention is equipped with a sensor unit in which anodes of N (N being an integer of 2 or more) diode sensors are connected to each other, a common terminal connected to a connection portion where the anodes are connected to each other, N input terminals connected to cathodes of the diode sensors, N+1 protection circuits connected to the input terminals and the common terminal, an I-V conversion circuit which converts an output current of each diode sensor into a voltage, a chopper circuit which switches the polarity of the output current and inputs the (Continued)

same to the I-V conversion circuit, and a dummy protection circuit connected to the input of the I-V conversion circuit.

14 Claims, 15 Drawing Sheets

(51) Int. Cl.
  *H01L 27/02* (2006.01)
  *H01L 31/02* (2006.01)
(58) Field of Classification Search
  USPC .. 327/52, 53, 58, 60, 62, 63, 65–69, 71, 72, 327/74, 77–81, 88, 89, 96, 127, 246, 266, 327/274, 280, 287, 359, 560–563, 327/108–112, 379, 389, 391; 326/22–27, 326/81–87
  See application file for complete search history.

(56) References Cited

U.S. PATENT DOCUMENTS

| | | | | |
|---|---|---|---|---|
| 2001/0017783 | A1* | 8/2001 | Bruckmann | H03K 17/0828 363/97 |
| 2003/0071196 | A1 | 4/2003 | Seitz | |
| 2012/0105033 | A1 | 5/2012 | Tateishi et al. | |
| 2012/0193992 | A1* | 8/2012 | Heuermann | G01R 33/3852 307/84 |
| 2014/0043032 | A1* | 2/2014 | Makino | H03K 17/6871 324/434 |
| 2014/0312935 | A1* | 10/2014 | Aherne | H03K 17/08104 327/109 |
| 2015/0028216 | A1 | 1/2015 | Camargo | |

FOREIGN PATENT DOCUMENTS

| | | |
|---|---|---|
| JP | 2001-004444 A | 1/2001 |
| JP | 2011-004444 A | 1/2001 |
| JP | 2003-202264 A | 7/2003 |
| JP | 2006-153492 A | 6/2006 |
| JP | 2011-119398 A | 6/2011 |
| JP | 2013-124879 A | 6/2013 |
| WO | 2011/001523 A1 | 1/2011 |
| WO | 2013/145757 A1 | 10/2013 |

OTHER PUBLICATIONS

Supplementary European Search Report dated Jan. 17, 2017 for corresponding European Patent Application No. 15734817.8.
International Preliminary Report on Patentability dated Jul. 21, 2016, for the corresponding International Application No. PCT/JP2015/000040.

* cited by examiner

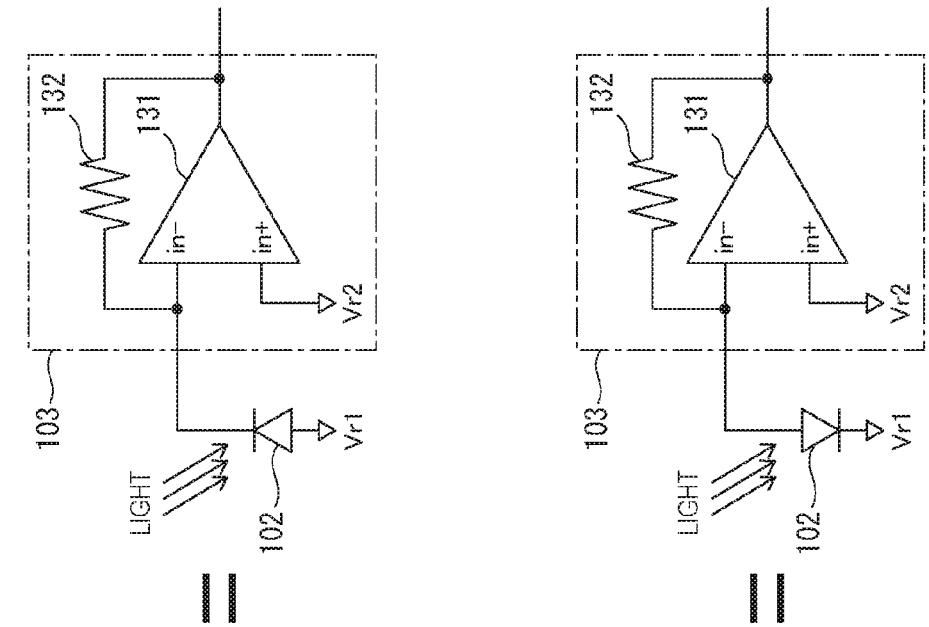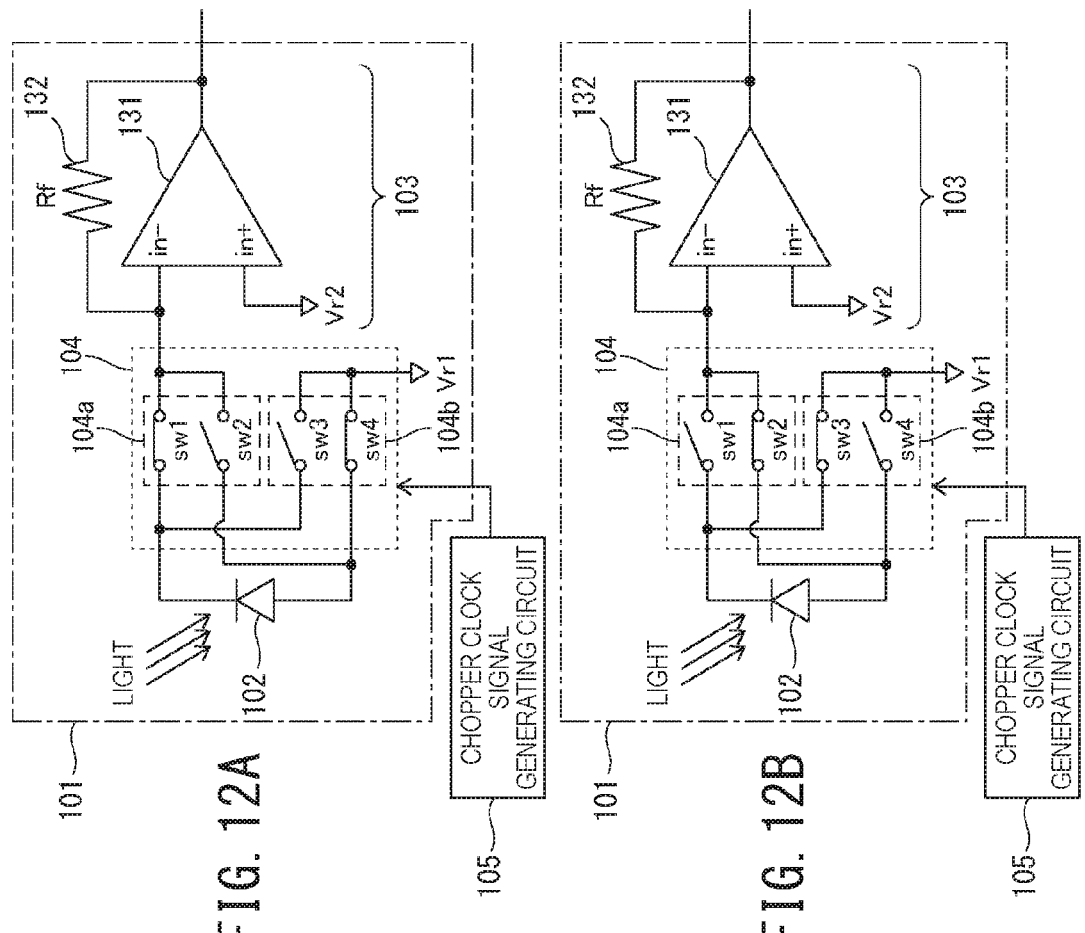

SW OPERATION WHEN CHOPPER FREQUENCY>AUTO-ZERO AMPLIFIER OPERATING FREQUENCY

FIG. 20A

| sw1,sw4 | OFF | ON | OFF | ON | ON | OFF | ON | OFF | OFF |
|---|---|---|---|---|---|---|---|---|---|

FIG. 20B

| sw2,sw3 | ON | OFF | ON | OFF | OFF | ON | OFF | ON | ON |
|---|---|---|---|---|---|---|---|---|---|

FIG. 20C

| sw5,sw8 | OFF | ON | OFF | ON |
|---|---|---|---|---|

FIG. 20D

| sw6,sw7 | ON | OFF | ON | OFF |
|---|---|---|---|---|

|—PHASE 1—|—PHASE 2—|—PHASE 1—|—PHASE 2—|

SW OPERATION WHEN CHOPPER FREQUENCY<AUTO-ZERO AMPLIFIER OPERATING FREQUENCY

FIG. 20E

| sw1,sw4 | OFF | ON | OFF |
|---|---|---|---|

FIG. 20F

| sw2,sw3 | ON | OFF | ON |
|---|---|---|---|

FIG. 20G

| sw5,sw8 | OFF | ON | OFF | ON |
|---|---|---|---|---|

FIG. 20H

| sw6,sw7 | ON | OFF | ON | OFF |
|---|---|---|---|---|

|—PHASE 1—|—PHASE 2—|—PHASE 1—|—PHASE 2—|

OUTPUT-CURRENT DETECTION CHIP FOR DIODE SENSORS, AND DIODE SENSOR DEVICE

TECHNICAL FIELD

The present invention relates to an output-current detection IC chip for diode sensors, and a diode sensor device thereof. More particularly, the present invention relates to an output-current detection IC chip for diode sensors and a diode sensor device adapted so as to reduce the influence by a leak current of each protection circuit without eliminating the protection circuit. In particular, the present invention can be applied to an infrared sensor, a gas sensor, etc.

BACKGROUND ART

It has heretofore been known that in a system of processing signals from a plurality of detection elements, one ends of the plural detection element are made common for a reduction in the number of terminals and due to structural constraints (refer to, for example, Patent Literature 1).

It has also been known that in a circuit which processes signals from sensors in which one ends of a plurality of detection elements are made common, a chopper operation adapted to perform signal processing by switching the orientation of each detection element is performed to cancel an offset.

Further, there has been proposed an infrared sensor module equipped with an infrared sensor, an IC element which performs signal processing on an output signal of the infrared sensor, and a package in which the infrared sensor and the IC element are stored. Moreover, it is general that in a semiconductor device such as an IC, an ESD protection circuit is provided on a chip to prevent the device from destruction due to electrostatic discharge (ESD: Electro-Static Discharge).

A sensor device equipped with a sensor element and an IC element signal-processing an output voltage of the sensor element often amplifies the output voltage to perform its signal processing because the amplitude of the output voltage of the sensor element is small and the output impedance of the sensor element is high. For example, since in the above-described infrared sensor module, the amplitude of the output voltage of the infrared sensor as the sensor element is small, and the output impedance of the infrared sensor is high, an amplifier circuit which amplifies the output voltage of the infrared sensor, an A/D conversion circuit which analog-to-digital converts the analog output voltage of this amplifier circuit, etc. are considered to be provided in the IC element.

For example, the sensor device described in Patent Literature 2 relates to a sensor device in which an ESD protection circuit is provided in each of an infrared sensor as a sensor element and an IC element. This is one provided with offset canceling unit which, in order to avoid the occurrence of an offset voltage caused by a leak current flowing through each ESD protection circuit and a reduction in S/N ratio, cancels an offset voltage determined by a leak current flowing through a sensor unit due to a first ESD protection circuit and a second ESD protection circuit and the impedance of the sensor unit.

Further, there has been illustrated in Patent Literature 3, a configuration which is provided with a sensor element, a signal processing device that processes an output current of the sensor element, and a correction arithmetic unit that performs a temperature correction, and in which the output current from the sensor element is converted into a voltage by a current-voltage converter.

Moreover, there has been illustrated in Patent Literature 4, a configuration which is provided with a sensor unit, a switch, and a full differential amplifier and performs signal processing on an output voltage from the sensor unit. In this Patent Literature 4, the output voltage from the sensor unit is chopper-modulated by the switch to perform its signal processing.

CITATION LIST

Patent Literature

PTL 1: WO 2013/145757 PAMPHLET
PTL 2: JP 2013-124879 A
PTL 3: JP 2011-119398 A
PTL 4: JP 2006-153492 A

SUMMARY OF INVENTION

Technical Problem

However, in those described in Patent Literatures 1 and 2 described above, it is difficult, in particular for a system for detecting a micro current of pA order to detect an output current of a diode sensor with satisfactory accuracy. In particular, the offset due to the leak current of the protection circuit is a non-negligible level. Further, there is a problem that the protection circuit cannot be eliminated in order to ensure an ESD breakdown voltage.

Further, in the configurations of Patent Literatures 3 and 4, an input offset of a first-stage amplifier is amplified by an amplifier circuit provided in a subsequent stage in a manner similar to an output signal equivalent to the output voltage of the infrared sensor element. It is therefore difficult to detect the output current of the diode sensor with satisfactory accuracy. In particular, in the circuit having the conventional configuration, which performs signal processing on the output voltage from the infrared sensor element, the accuracy of detection is degraded even by a variation in the resistance value of an internal resistor of the sensor element, temperature characteristics, etc.

The present invention has been made in view of such problems. An object of the present invention is to provide an output-current detection IC chip for diode sensors and a diode sensor device each capable of detecting an output current of each diode sensor with satisfactory accuracy.

Solution to Problem

According to one aspect of the present invention, the present invention is characterized by the following matters.

(1); There is provided an output-current detection IC chip for diode sensors, which is equipped with a common terminal connected to one ends of N (N is an integer of 2 or more) diode sensors, N input terminals connected to the other ends of the respective diode sensors, N+1 protection circuits connected to the N input terminals and the common terminal, a chopper circuit which switches the polarity of an output current of each diode sensor, an I-V conversion circuit which converts the output current from the chopper circuit into a voltage, and a current supplying unit which supplies a compensation current to an input of the I-V conversion circuit.

(2); in (1), the common terminal is connected to anodes of the N (N is an integer of 2 or more) diode sensors, and the N input terminals are connected to cathodes of the respective diode sensors.

(3); in (1), the common terminal is connected to the cathodes of the N (N is an integer of 2 or more) diode sensors, and the N input terminals are connected to the anodes of the respective diode sensors.

(4); in any of (1)-(3), the current supplying unit supplies the compensation current to the input of the I-V conversion circuit according to switching of the chopper circuit.

(5); in any of (1)-(4), the current supplying unit is a dummy protection circuit.

(6); in (5), there is further provided a switch which switches whether or not to connect the dummy protection circuit to the input of the I-V conversion circuit according to the switching of the chopper circuit.

(7); in (5), there are further provided switches which switch whether or not to connect the dummy protection circuit to the input terminals according to the switching of the chopper circuit.

(8); in (6) or (7), the switch switches whether or not to connect the dummy protection circuit to the input of the I-V conversion circuit such that the number at which the dummy protection circuit is electrically connected to the input of the I-V conversion circuit becomes the same number before and after the switching of the polarity of each output current.

(9); in any of (5)-(8), the dummy protection circuit is arranged adjacent to the protection circuits.

(10); in any of (1)-(9), the output current of each diode sensor is detected in a time division manner, and the polarity of the output current is switched to detect the output current upon detection of the output current of each diode sensor.

(11); in any of (1)-(10), the chopper circuit has a first chopper switch unit connected to a first input terminal of a first diode sensor, a second chopper switch unit connected to a second input terminal connected to a second diode sensor, and a third chopper switch unit connected to the common terminal. The first chopper switch unit and the third chopper switch unit switch the polarity of an output current of the first diode sensor, and the second chopper switch unit and the third chopper switch unit switch the polarity of an output current of the second diode sensor.

(12); in any of (1)-(11), the common terminal is connected to a connection portion where the anodes of the respective diode sensors are connected to each other, or a connection portion where the cathodes of the respective diode sensors are connected to each other.

(13); There is provided a diode sensor device equipped with an output-current detection IC chip for diode sensor devices described in any one of (1)-(12), and a sensor unit having N (N is an integer of 2 or more) diode sensors.

(14); in (13), the diode sensor is an infrared sensor.

(15); There is provided an output-current detection IC chip for a diode sensor, which is equipped with a first terminal connected to one end of the diode sensor, a second terminal connected to the other end of the diode sensor, an I-V conversion circuit which converts an output current of the diode sensor into a voltage, a chopper circuit which switches between a state of connecting the diode sensor to the I-V conversion circuit in a forward direction, and a state of connecting the diode sensor thereto in a reverse direction, and a predetermined voltage generating circuit which supplies a predetermined voltage to the first terminal or the second terminal.

(16); in (15), the I-V conversion circuit has an auto-zero amplifier and a feedback resistor.

(17); in (15) or (16), the chopper circuit switches between a state in which the predetermined voltage is supplied to the first terminal, and the second terminal is connected to an input end of the I-V conversion circuit, and a state in which the predetermined voltage is supplied to the second terminal, and the first terminal is connected to the input end of the I-V conversion circuit.

(18); in any of (15)~(17), the chopper circuit is connected between the first terminal and the second terminal, and the input end of the I-V conversion circuit.

(19); in any of (15)~(18), an arithmetic unit which calculates a difference between an output voltage of the I-V conversion circuit when the polarity of the output current is forward-inverted, and an output voltage of the I-V conversion circuit when the polarity of the output current is reverse-inverted is provided in a subsequent stage of the I-V conversion circuit.

(20); There is provided a diode sensor device equipped with an output-current detection IC chip for a diode sensor described in any one of (15)~(19), the diode sensor, a first wiring which connects one end of the diode infrared sensor and the first terminal, and a first wiring which connects the other end of the diode infrared sensor and the second terminal.

Advantageous Effects of Invention

According to one aspect of the present invention, it is possible to achieve an output-current detection IC chip for diode sensors and a diode sensor device each capable of detecting an output current of each diode sensor with satisfactory accuracy.

It is possible to achieve an output-current detection IC chip for diode sensors and a diode sensor device, which reduce the influence by a leak current of each protection circuit without eliminating the protection circuit particularly in the case of signal-processing a plurality of sensors.

Further, it is possible to achieve an output-current detection IC chip for a diode sensor and a diode sensor device, which perform IV conversion by switching the polarity of an output current to thereby raise the detection accuracy of a signal.

BRIEF DESCRIPTION OF DRAWINGS

FIGS. 12A and 12B are configuration diagrams for describing an embodiment 4 of a diode sensor device according to the present invention, and is a diagram illustrating one example of an output-current detection IC;

FIGS. 20A-20H are diagrams illustrating a timing chart illustrating the operations of the auto-zero amplifier and the chopper switches of the chopper circuit in the infrared sensor signal processing IC chip illustrated in FIG. 19.

DESCRIPTION OF EMBODIMENTS

In the following detailed description, a large number of particular details are described so as to provide a thorough understanding of embodiments of the present invention. It will however be apparent that one or more embodiments can be implemented even without such particular details. Even in addition to it, in order to simplify the drawings, well-known structures and devices are illustrated in schematic drawings.

A diode sensor device examined as a premise of the present invention will first be described below. Problems where a chopper operation is performed while using one ends of a plurality of detection elements in common will be described while taking for example a system of current-voltage converting current signals from two diode sensors.

Figure 1:
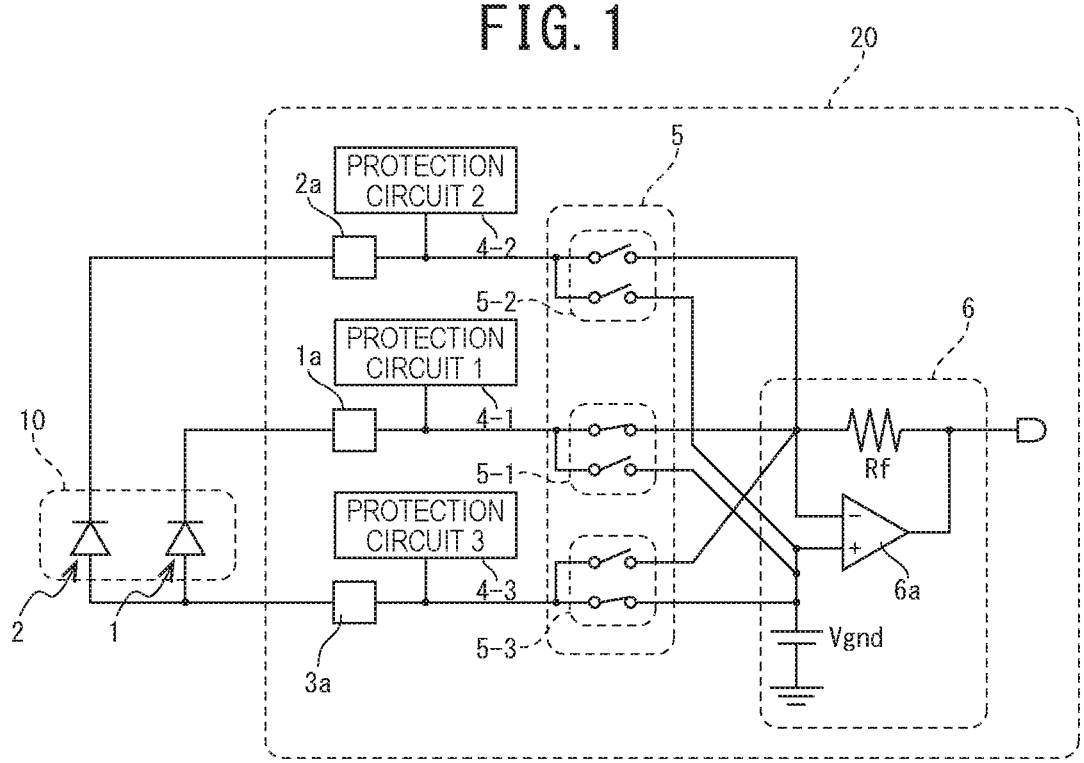
FIG. 1 is a circuit configuration diagram of a diode sensor device to be a premise of the present invention.

FIG. 1 is a circuit configuration diagram of a diode sensor device examined as a premise of the present invention. First and second diode sensors 1 and 2, first and second input terminals (PAD) 1a and 2a inputted with outputs of the diode sensors 1 and 2, a common terminal (PAD) 3a connected to a connection point where one ends of the diode sensors 1 and 2 are made common, an I-V conversion circuit 6 (having an amplifier 6a) which I-V converts an output current, and a chopper-driven chopper circuit 5 (comprised of first through third chopper switches 5-1 through 5-3) are provided. Here, in order to ensure an ESD breakdown voltage, first through third protection circuits (ESD protection circuits) 4-1 through 4-3 are respectively connected to each PAD. Incidentally, reference numeral 10 indicates a sensor unit, and 20 indicates an output-current detection IC chip.

Figure 2:
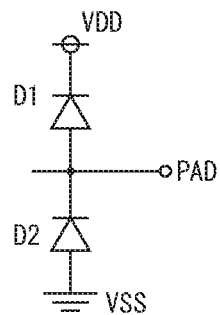
FIG. 2 is a diagram illustrating one example of a protection circuit illustrated in FIG. 1.

FIG. 2 is a diagram illustrating one example of the protection circuit illustrated in FIG. 1 and is intended to connect a diode D1 between a positive power supply VDD and PAD in such a manner that a VDD side assumes a cathode and a PAD side assumes an anode and to connect a diode D2 between a negative power supply VSS and PAD in such a manner that a VSS side assumes an anode and the PAD side assumes a cathode. When an ESD pulse of a positive voltage is inputted, the diode D1 becomes forward biased to escape the ESD pulse to VDD. When an ESD pulse of a negative voltage is inputted, the diode D2 becomes forward biased to escape the ESD pulse to VSS, thereby protecting an internal circuit.

Figure 3:
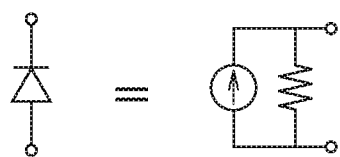
FIG. 3 is a diagram illustrating an equivalent circuit of the diode sensor in FIG. 1.
Figure 4:
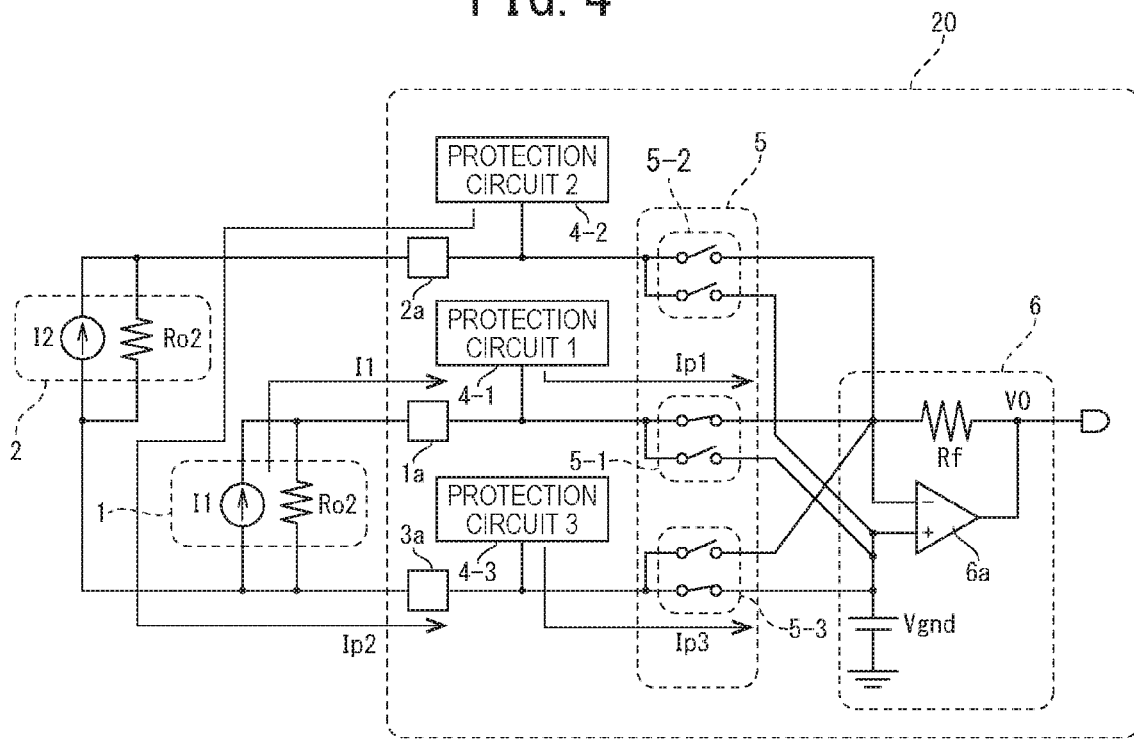
FIG. 4 is a diagram illustrating a state of chopper switches in a first phase (phase 1) of a chopper operation of a first diode sensor.
Figure 5:
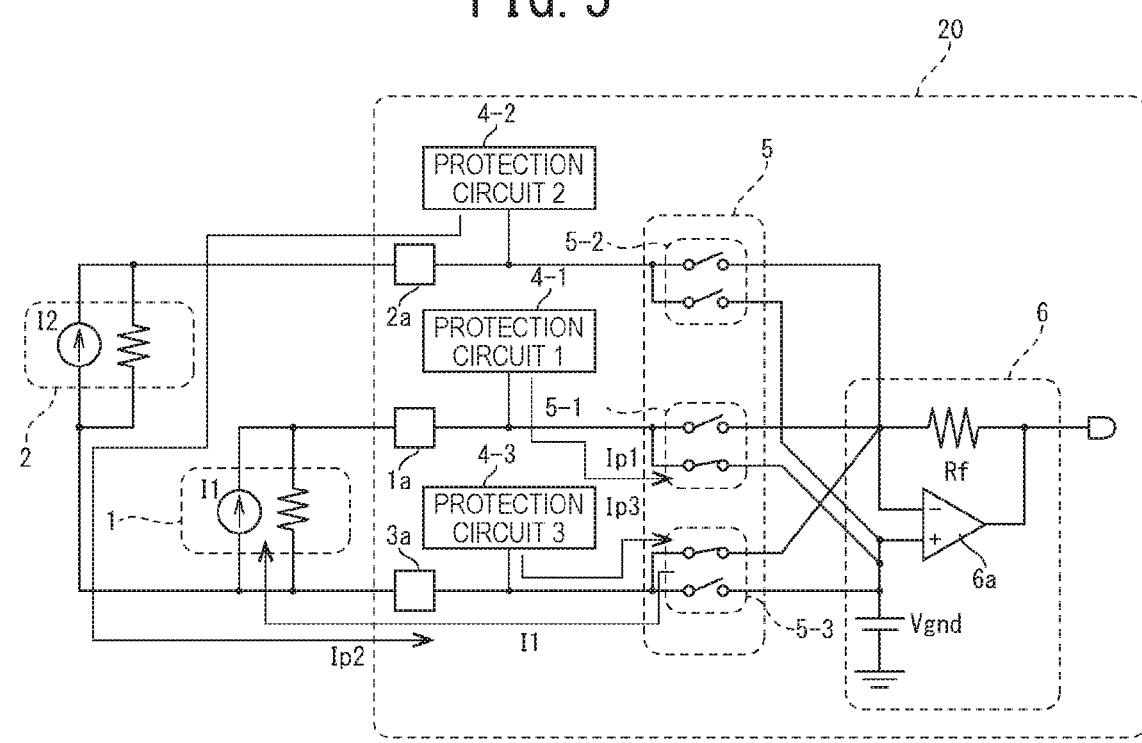
FIG. 5 is a diagram illustrating a state of the chopper switches in the other second phase (phase 2) of the chopper operation of the first diode sensor.

FIG. 3 is a diagram illustrating an equivalent circuit of the diode sensor in FIG. 1, and FIGS. 4 and 5 are respectively diagrams in which the sensor unit in FIG. 1 is replaced with the equivalent circuit of the diode sensor illustrated in FIG. 3.

FIG. 4 is a diagram illustrating a state of chopper switches in a first phase (phase 1) of a chopper operation of the first diode sensor, and FIG. 5 is a diagram illustrating a state of the chopper switches in the other second phase (phase 2) of the chopper operation of the first diode sensor.

A description will be made below about the output voltage of the I-V conversion circuit in each phase.

<Phase 1>

An output current I1 of the first diode sensor 1 is converted into a voltage by flowing through a feedback resistor Rf of the I-V conversion circuit 6. A leak current Ip1 of the first protection circuit 4-1 is converted into a voltage by flowing through the feedback resistor Rf. A leak current Ip2 of the second protection circuit 4-2 is absorbed into Vgnd being a voltage source by flowing through an output resistor Ro2 of the second diode sensor 2. A leak current Ip3 of the third protection circuit 4-3 is absorbed into Vgnd being the voltage source.

As a result, the output voltage Vo1 in the phase 1 is represented by the following equation (1):

$$Vo1 = Vgnd - Rf(I1 + Ip1) \qquad \text{Equation (1)}$$

<Phase 2>

An output current I1 of the first diode sensor 1 is converted into a voltage by flowing through the feedback resistor Rf. A leak current Ip1 of the first protection circuit 4-1 is absorbed into Vgnd being the voltage source. A leak current Ip2 of the second protection circuit 4-2 is converted into a voltage by flowing through the output resistor Ro2 of the second diode sensor 2 and the feedback resistor Rf. A leak current Ip3 of the third protection circuit 4-3 is converted into a voltage by flowing through the feedback resistor Rf.

As a result, the output voltage Vo2 in the phase 2 is represented by the following equation (2):

$$Vo2 = Vgnd - Rf(-I1 + Ip2 + Ip3) \qquad \text{Equation (2)}$$

From the equation (1) and the equation (2) as above, the output Vo after chopper demodulation is represented by the following equation (3):

$$Vo = Vo1 - Vo2$$

$$= -2 \times Rf \times I1 - Rf(Ip1 - Ip2 - Ip3)$$

Equation (3)

Here, when the first protection circuit 4-1 through the third protection circuit 4-3 are the same protection circuit, the respective leak currents Ip1 through Ip3 are assumed to be approximately the same current value Ip. The equation (3) therefore becomes the following equation (4):

$$Vo = -2 \times Rf \times I1 + Rf \times Ip$$

Equation (4)

In other words, the influence of the leak current of the protection circuit appears in the output.

The diode sensor device of the present embodiment 1 is equipped with a sensor unit in which anodes (or cathodes) of N pieces (N is an integer of 2 or more) of diode sensors are connected to each other, a common terminal connected to connection portion where the anodes (or cathodes) are connected to each other, N pieces of input terminals connected to the cathodes (or anodes) of the respective diode sensors, N+1 pieces of protection circuits connected to the input terminals and the common terminal, an I-V conversion circuit which converts an output current into a voltage, a chopper circuit which switches the polarity of the output current and inputs same to the I-V conversion circuit, and a dummy protection circuit connected to the input of the I-V conversion circuit. Incidentally, each drawing described below illustrates a state in which the anodes of the diode sensors are connected to each other.

Thus, by providing the dummy protection circuit being a current supplying unit which supplies a compensation current to the input of the I-V conversion circuit, it can be configured so as to cancel a difference in leak current at the time of forward inversion of chopper driving and its reverse inversion. It is possible to reduce the influence due to the leak current of the protection circuit.

Also, there is further provided a switch which switches whether or not to connect the dummy protection circuit to the input of the I-V conversion circuit. The switch performs switching in such a manner that the number at which the protection circuits are electrically connected to the input of the I-V conversion circuit becomes the same number before and after the switching of the polarity of the output current. Thus, the dummy protection circuit can be configured so as to cancel the difference in leak current at the time of the forward inversion of the chopper driving and its reverse inversion. It is possible to reduce the influence due to the leak current of the protection circuit.

In the present embodiment 1, the dummy protection circuit is a dummy circuit for each protection circuit. It is preferable that the dummy protection circuit is substantially the same configuration as the protection circuit. As the protection circuit, there is mentioned a configuration in which a first diode is connected between a power supply voltage and PAD such that a power supply voltage side assumes a cathode and a PAD side assumes an anode and in which a second diode is connected between a ground potential and PAD such that a ground potential side assumes an anode and a PAD side assumes a cathode. The dummy protection circuit is preferably disposed adjacent to each protection circuit.

The respective embodiments of the present invention will be described below with reference to the drawings.

Embodiment 1

Figure 6:
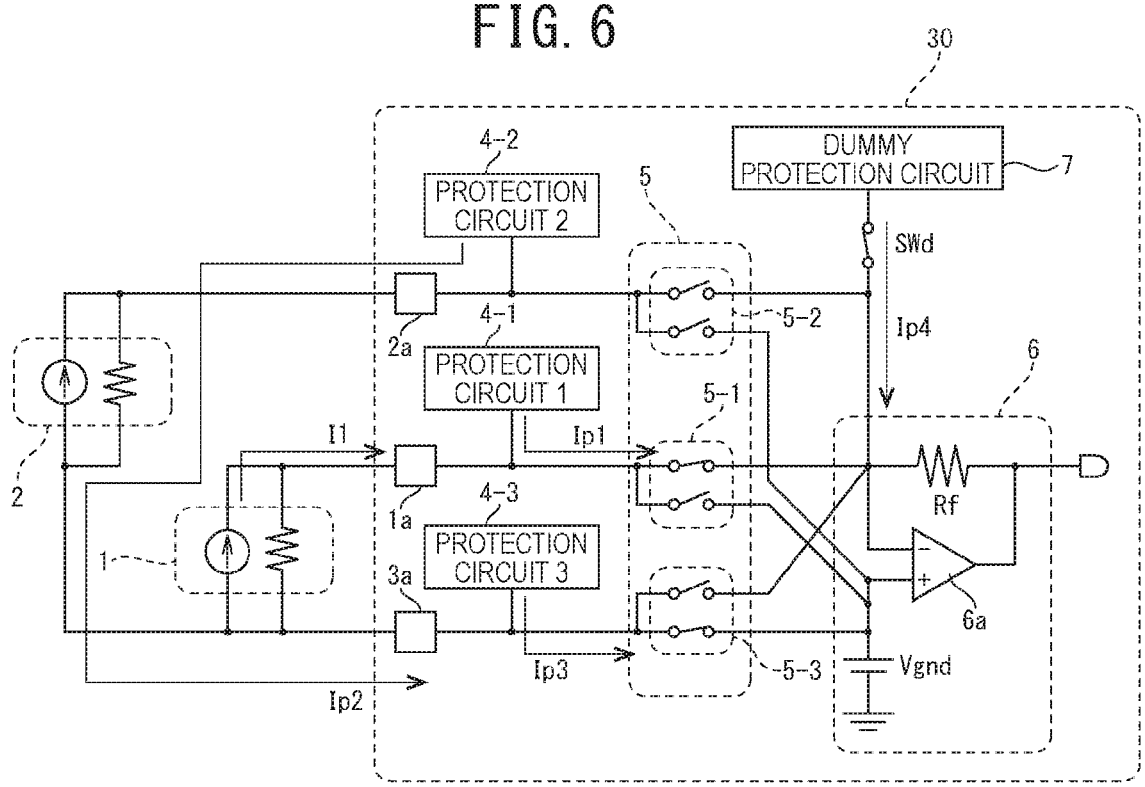
FIG. 6 is a circuit configuration diagram for describing an embodiment 1 of a diode sensor device according to the present invention, and is a diagram illustrating a state of chopper switches and a switch in a first phase (phase 1) of a chopper operation of a first diode sensor.
Figure 7:
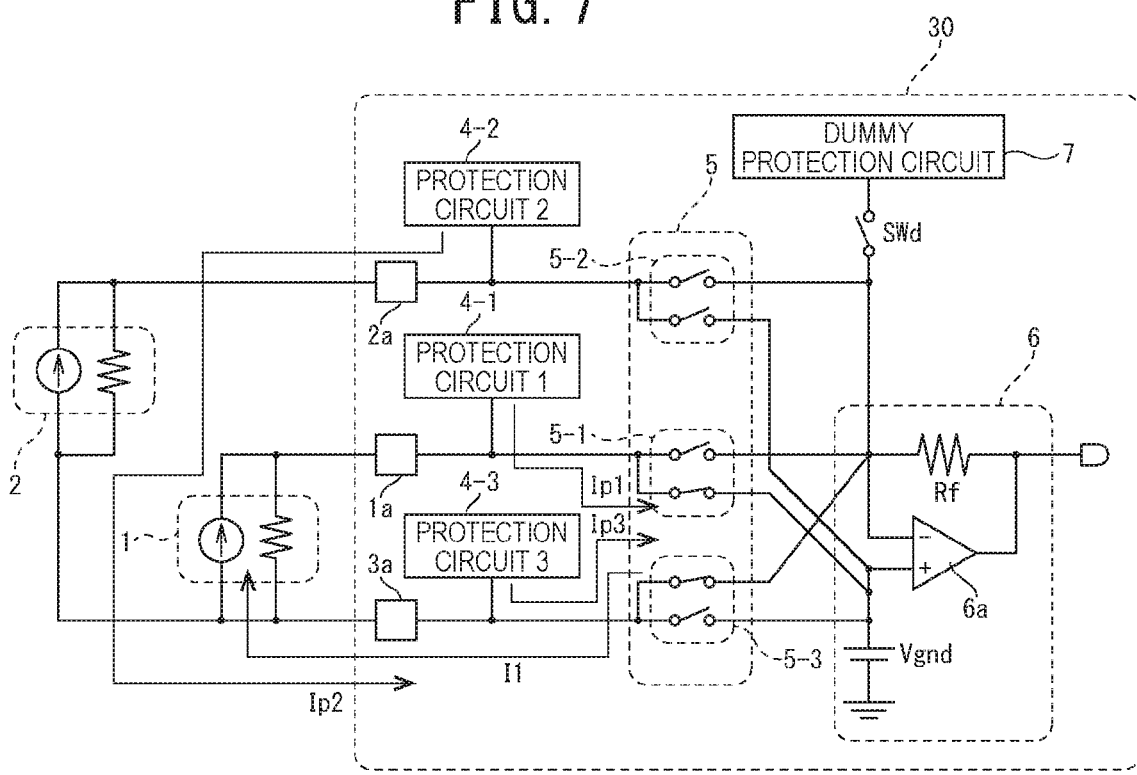
FIG. 7 is a circuit configuration diagram for describing the embodiment 1 of the diode sensor device according to the present invention, and is a diagram illustrating a state of the chopper switches and the switch in the other second phase (phase 2) of the chopper operation of the first diode sensor.

FIGS. 6 and 7 are circuit configuration diagrams for describing an embodiment 1 of a diode sensor device according to the present invention. FIG. 6 is a diagram illustrating a state of each chopper switch and a switch in a first phase (phase 1) of a chopper operation of a first diode sensor. FIG. 7 is a diagram illustrating a state of each chopper switch and the switch in the other second phase (phase 2) of the chopper operation of the first diode sensor. Reference numeral 7 in the drawing indicates a dummy protection circuit (dummy ESD protection circuit). 30 indicates an output-current detection IC chip. Incidentally, components having the same function as those in FIG. 1 are denoted by the same reference numerals. Also, FIGS. 6 and 7 illustrate a state in which the anodes of the diode sensors are connected to each other.

The diode sensor device of the present embodiment 1 is comprised of a sensor unit 10 and an output-current detection IC chip 30.

The sensor unit 10 is one in which anodes (or cathodes) of N pieces (N is an integer of 2 or more) of diode sensors 1, 2, . . . are connected to each other. Further, the output-current detection IC chip 30 is equipped with a common terminal 3a, N input terminals 1a, 2a, . . . , N+1 protection circuits 4-1 through 4-3, . . . , an I-V conversion circuit 6, a chopper circuit 5, and a dummy protection circuit 7.

The common terminal 3a is connected to a connection portion where the anodes (or cathodes) are connected to each other. Also, the N input terminals 1a, 2a, . . . are those connected to the cathodes (or anodes) of the diode sensors 1 and 2.

The N+1 protection circuits 4-1 through 4-3, . . . are those connected to the input terminals 1a and 2a and the common terminal 3a. Further, the I-V conversion circuit 6 is one which converts an output current of each of the diode sensors 1 and 2 into a voltage.

Further, the chopper circuit 5 is one which switches the polarity of the output current and inputs the same to the I-V conversion circuit 6. Incidentally, although not illustrated, there is included a chopper clock signal generating circuit which generates a chopper clock signal switching respective chopper switch units of the chopper circuit 5. Further, a switch SWd to be described later may also be configured to be controlled by this chopper clock signal.

Further, the dummy protection circuit 7 is one connected to the input of the I-V conversion circuit 6. Moreover, the switch SWd which switches whether or not to connect the dummy protection circuit 7 to the input of the I-V conversion circuit 6 is further provided.

Further, when the polarity of the output current is switched by the chopper circuit 5, whether or not to connect the dummy protection circuit 7 to the input of the I-V conversion circuit 6 is switched by the switch SWd.

Moreover, the switch SWd switches whether or not to connect the dummy protection circuit 7 to the input of the I-V conversion circuit 6 in such a manner that the number at which the dummy protection circuit 7 is electrically connected to the input of the I-V conversion circuit 6 becomes the same number before and after the switching of the polarity of the output current.

Further, the chopper circuit 5 has a first chopper switch unit 5-1 connected to the first input terminal 1a, a second chopper switch unit 5-2 connected to the second input terminal 2a, and a third chopper switch unit 5-3 connected to the common terminal 3a. The polarity of the output current of the first diode sensor 1 is switched by the first chopper switch unit 5-1 and the third chopper switch unit 5-3. The polarity of the output current of the second diode sensor 2 is switched by the second chopper switch unit 5-2 and the third chopper switch unit 5-3.

Moreover, the first and second diode sensors 1 and 2 can be applied as infrared sensors.

That is, the diode sensor device of the present embodiment 1 is equipped with the first and second diode sensors 1 and 2, the input terminals (PAD) 1a and 2a inputted with diode sensor outputs, the common terminal (PAD) 3a connected to a connection point where one ends of the first and second diode sensors 1 and 2 are made common, the I-V conversion circuit 6 which performs sensor output I-V conversion, and the chopper-driven chopper circuit 5.

Here, in order to ensure an ESD breakdown voltage, the first through third protection circuits 4-1 through 4-3 are respectively connected to each PAD. Further, in the present embodiment 1, the dummy protection circuit 7 is provided. The chopper circuit 5 has the switch SWd which switches whether or not to connect the dummy protection circuit 7 to the input of the I-V conversion circuit 6.

Further, the chopper circuit 5 has the first chopper switch unit 5-1 connected to the first input PAD 1a, the second chopper switch unit 5-2 connected to the second input PAD 2a, and the third chopper switch unit 5-3 connected to the common PAD 3a.

The polarity of the output current of the first diode sensor 1 is switched by the first chopper switch unit 5-1 and the third chopper switch unit 5-3. For example, in a phase 1, the first input PAD 1a is connected to an inversion input terminal of an amplifier 6a of the I-V conversion circuit 6, and the common PAD 3a is connected to a non-inversion input terminal of the amplifier 6a to provide a predetermined voltage (Vgnd). Further, in a phase 2, the first input PAD 1a is connected to the non-inversion input terminal of the amplifier 6a of the I-V conversion circuit 6 to provide the predetermined voltage (Vgnd). The common PAD 3a is connected to the inversion input terminal of the amplifier 6a. In this manner, the polarity of the output current of the first diode sensor 1 is switched. When the polarity of the output current of the first diode sensor 1 is switched, the second chopper switch unit 5-2 is rendered into an OFF state at this time.

The polarity of the output current of the second diode sensor 2 is switched by the second chopper switch unit 5-2 and the third chopper switch unit 5-3. For example, in the phase 1, the second input PAD 2a is connected to the inversion input terminal of the amplifier 6a of the I-V conversion circuit 6, and the common PAD 3a is connected to the non-inversion input terminal of the amplifier 6a to provide the predetermined voltage (Vgnd). Further, in the phase 2, the second input PAD 2a is connected to the non-inversion input terminal of the amplifier 6a of the I-V conversion circuit 6 to provide the predetermined voltage (Vgnd). The common PAD 3a is connected to the inversion input terminal of the amplifier 6a. In this manner, the polarity of the output current of the second diode sensor 2 is switched. When the polarity of the output current of the second diode sensor 2 is switched, the first chopper switch unit 5-1 is rendered into an OFF state at this time.

A description will be made below about the output voltage of the I-V conversion circuit 6 in each phase.

<Phase 1>

An output current I1 of the first diode sensor 1 is converted into a voltage by flowing through a feedback resistor Rf of the I-V conversion circuit 6. A leak current Ip1 of the first protection circuit 4-1 is converted into a voltage by flowing through the feedback resistor Rf. A leak current Ip2 of the second protection circuit 4-2 is absorbed into Vgnd being a voltage source by flowing through an output resistor Ro2 of the second diode sensor 2. A leak current Ip3 of the third protection circuit 4-3 is absorbed into Vgnd being the voltage source. Since the switch SWd is ON, a leak current Ip4 of the dummy protection circuit 7 is converted into a voltage by flowing through the feedback resistor Rf.

As a result, the output voltage Vo1 in the phase 1 is represented by the following equation (5):

$$Vo1 = Vgnd - Rf(I1 + Ip1 + Ip4) \quad \text{Equation (5)}$$

<Phase 2>

An output current I1 of the first diode sensor 1 is converted into a voltage by flowing through the feedback resistor Rf. A leak current Ip1 of the first protection circuit 4-1 is absorbed into Vgnd being the voltage source. A leak current Ip2 of the second protection circuit 4-2 is converted into a voltage by flowing through the output resistor Ro2 of the second diode sensor 2 and the feedback resistor Rf. A leak current Ip3 of the third protection circuit 4-3 is converted into a voltage by flowing through the feedback resistor Rf. A leak current Ip4 of the dummy protection circuit 7 does not flow because the switch SWd is OFF.

As a result, the output voltage Vo2 in the phase 2 is represented by the following equation (6):

$$Vo2 = Vgnd - Rf(-I1 + Ip2 + Ip3) \quad \text{Equation (6)}$$

From the equation (5) and the equation (6) as above, the output Vo after chopper demodulation is represented by the following equation (7):

$$Vo = Vo1 - Vo2 \quad \text{Equation (7)}$$
$$= -2 \times Rf \times I1 - Rf(Ip1 - Ip2 - Ip3 + Ip4)$$

Here, when the first through third protection circuits 4-1 through 4-3 are the same protection circuit, the respective leak currents Ip1 through Ip4 are assumed to be approximately the same current value Ip. The equation (7) therefore becomes the following equation (8):

$$Vo = -2 \times Rf \times I1 \quad \text{Equation (8)}$$

In other words, the leak currents are cancelled, and only a detected signal is outputted.

When the number of diode sensors is N, there are at least N+1 PAD in total of N input PAD and a common PAD, and protection circuits (N+1) respectively exist in each PAD. Dummy protection circuits corresponding to such a number to which the number of protection circuits each of which would generate a leak current flowing into an I-V conversion circuit becomes identical are connected at the time of forward inversion of chopper driving of each sensor and its reverse inversion to thereby make it possible to reduce the influence of the leak current. That is, when the number of the diode sensors is N, N−1 dummy protection circuits may be connected because there is a difference in leak current between N−1 protection circuits at the time of the forward inversion and the reverse inversion.

Embodiment 2

Figure 8:
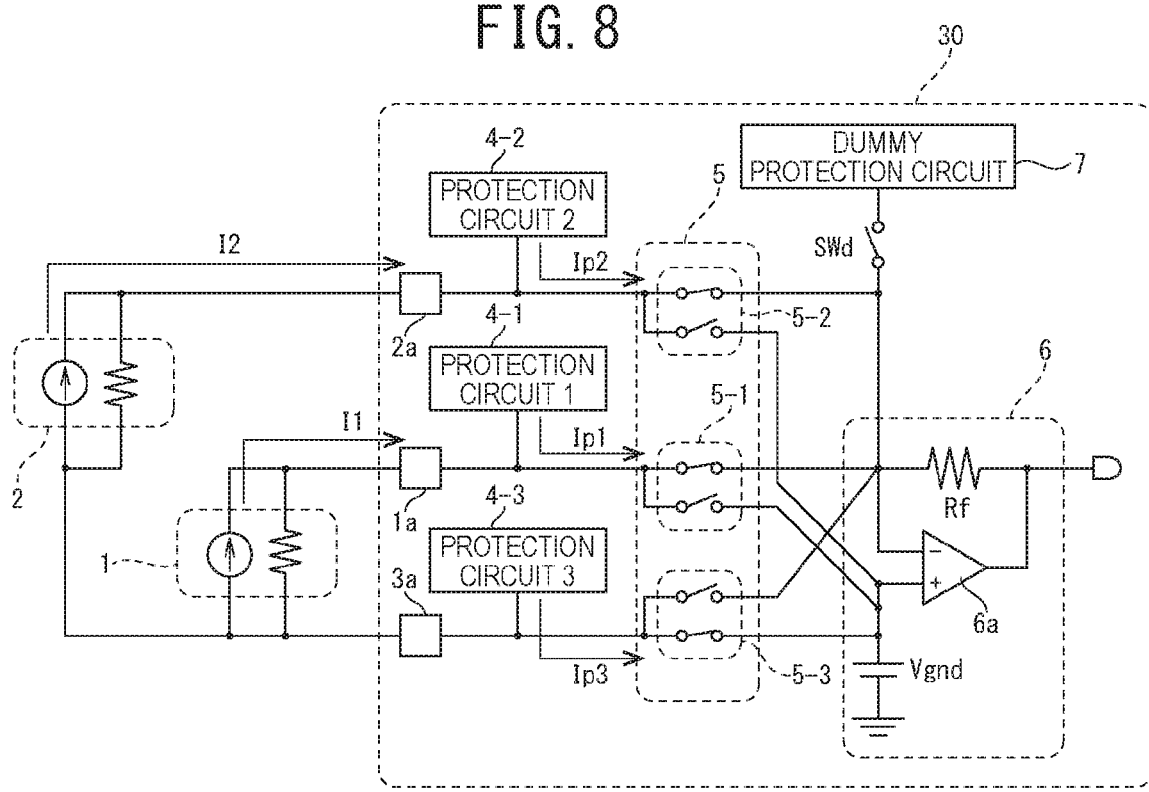
FIG. 8 is a circuit configuration diagram for describing an embodiment 2 of a diode sensor device according to the present invention, and is a diagram illustrating a state of chopper switches and a switch in a first phase (phase 1) of chopper operations of first and second diode sensors.
Figure 9:
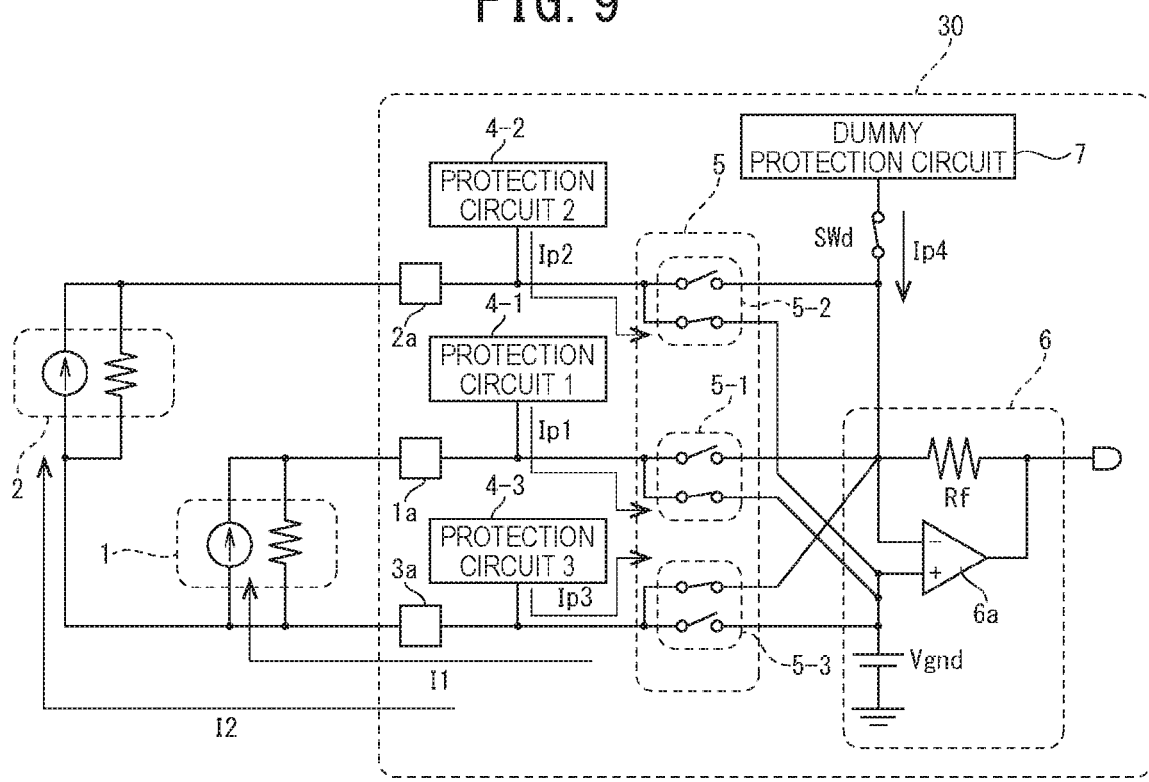
FIG. 9 is a circuit configuration diagram for describing the embodiment 2 of the diode sensor device according to the present invention, and is a diagram illustrating a state of the chopper switches and the switch in the other second phase (phase 2) of the chopper operations of the first and second diode sensors.

FIGS. 8 and 9 are circuit configuration diagrams for describing an embodiment 2 of a diode sensor device according to the present invention, and are circuit configuration diagrams where the first and second diode sensors illustrated in FIGS. 6 and 7 are simultaneously subjected to signal processing.

FIG. 8 is a diagram illustrating a state of each chopper switch and a switch in a first phase (phase 1) of a chopper operation of each of the first and second diode sensors. FIG. 9 is a diagram illustrating a state of each chopper switch and the switch in the other second phase (phase 2) of the chopper operation of each of the first and second diode sensors. Incidentally, components having the same function as those in FIGS. 6 and 7 are denoted by the same reference numerals.

In the present embodiment 2, a chopper circuit performs switching in the following manner.

In the phase 1, a first input PAD 1a and a second input PAD 2a are connected to an inversion input terminal of an amplifier 6a of an I-V conversion circuit 6, and a common PAD 3 is connected to a non-inversion input terminal of the amplifier 6a to provide a predetermined voltage (Vgnd). Further, in the phase 2, the first input PAD 1a and the second input PAD 2a are connected to the non-inversion input terminal of the amplifier 6a of the I-V conversion circuit 6 to provide the predetermined voltage (Vgnd). The common PAD 3a is connected to the inversion input terminal of the amplifier 6a.

In the present embodiment 2, the chopper circuit is operated so as to simultaneously switch the polarities of output currents in the first and second diode sensors 1 and 2.

The output voltage of the I-V conversion circuit 6 in each phase will be described below.

<Phase 1>

An output current I1 of the first diode sensor 1 is converted into a voltage by flowing through a feedback resistor Rf of the I-V conversion circuit 6. An output current I2 of the second diode sensor 2 is converted into a voltage by flowing through the feedback resistor Rf of the I-V conversion circuit 6. A leak current Ip1 of a first protection circuit 4-1 is converted into a voltage by flowing through the feedback resistor Rf. A leak current Ip2 of a second protection circuit 4-2 is converted into a voltage by flowing through the feedback resistor Rf. A leak current Ip3 of a third protection circuit 4-3 is absorbed into Vgnd being a voltage source. A leak current Ip4 of a dummy protection circuit 7 does not flow because a switch SWd is OFF.

As a result, the output voltage Vo1 in the phase 1 is represented by the following equation (9):

$$Vo1 = Vgnd - Rf(I1 + I2 + Ip1 + Ip2) \quad \text{Equation (9)}$$

<Phase 2>

An output current I1 of the first diode sensor 1 is converted into a voltage by flowing through the feedback resistor Rf. An output current I2 of the second diode sensor 2 is converted into a voltage by flowing through the feedback resistor Rf. A leak current Ip1 of the first protection circuit 4-11 is absorbed into Vgnd being the voltage source. A leak current Ip2 of the second protection circuit 4-2 is absorbed into Vgnd being the voltage source. A leak current Ip3 of the third protection circuit 4-3 is converted into a voltage by flowing through the feedback resistor Rf. A leak current Ip4 of the dummy protection circuit 7 is converted into a voltage by flowing through the feedback resistor Rf because the switch SWd is ON.

As a result, the output voltage Vo2 in the phase 2 is represented by the following equation (10):

$$Vo2 = Vgnd - Rf(-I1 - I2 + Ip3 + Ip4) \quad \text{Equation (10)}$$

From the equation (9) and the equation (10) as above, the output Vo after chopper demodulation is represented by the following equation (11):

$$Vo = Vo1 - Vo2$$
$$= -2 \times Rf(I1 + I2) - Rf(Ip1 + Ip2 - Ip3 - Ip4) \quad \text{Equation (11)}$$

Here, when the first through second protection circuits 4-1 through 4-3 and the dummy protection circuit 7 are the same protection circuit, the respective leak currents Ip1 through Ip4 are assumed to be approximately the same current value Ip. The equation (11) therefore becomes the following equation (12):

$$Vo = -2 \times Rf \times (I1 + I2) \quad \text{Equation (12)}$$

In other words, the leak currents are cancelled, and only a detected signal is outputted.

Embodiment 3

When the number of diode sensors is N, there are at least N+1 PAD in total of N input PAD and a common PAD, and protection circuits (N+1) respectively exist in each PAD. Dummy protection circuits corresponding to such a number to which the number of protection circuits each of which would generate a leak current flowing into an I-V conversion circuit becomes identical are connected at the time of forward inversion of chopper driving of each sensor and its reverse inversion to thereby make it possible to reduce the influence of the leak current. That is, when the number of the diode sensors is N, N−1 dummy protection circuits may be connected because there is a difference in leak current between N−1 protection circuits at the time of the forward inversion and the reverse inversion.

Figure 10:
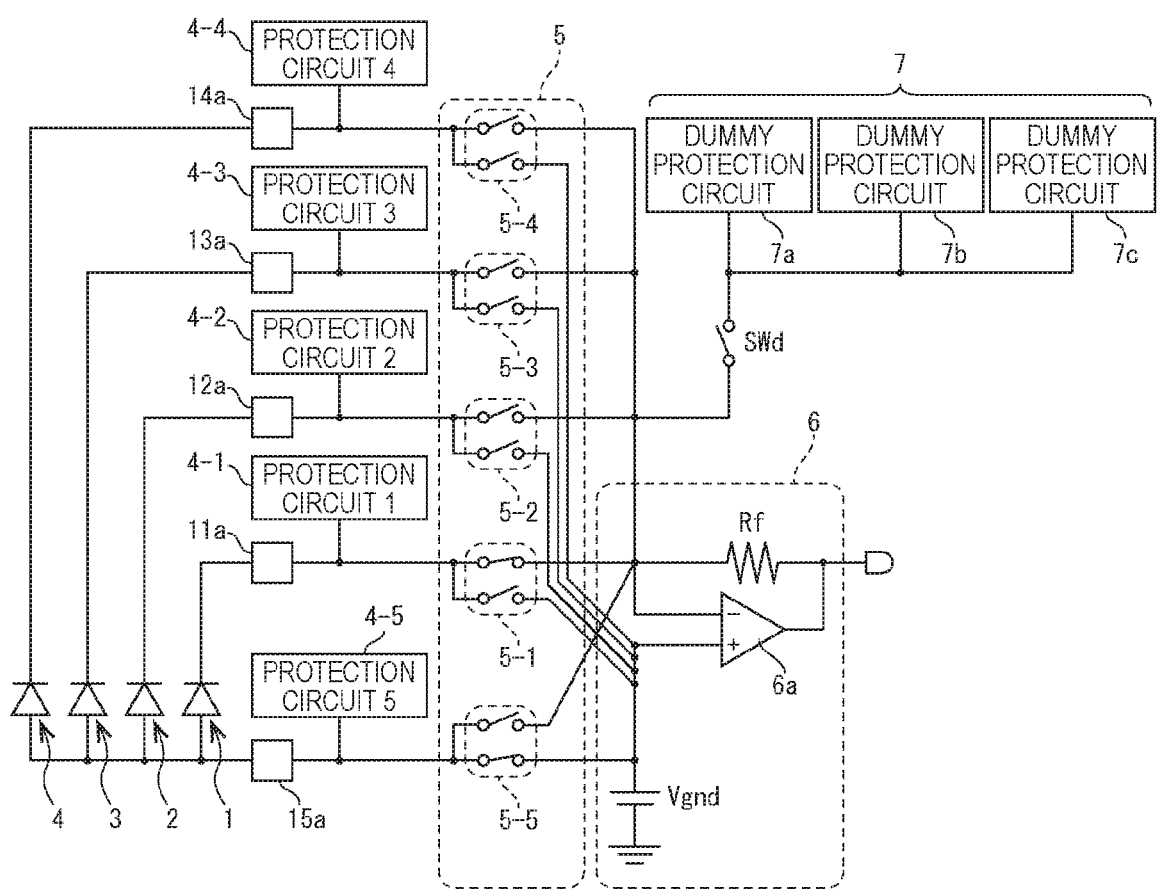
FIG. 10 is a circuit configuration diagram for describing an embodiment 3 of a diode sensor device according to the present invention.

FIG. 10 is a circuit configuration diagram for describing an embodiment 3 of a diode sensor device according to the present invention and is a diagram illustrating one example where the number of diode sensors is four. Incidentally, reference numeral 3 in the drawing indicates a third diode sensor, 4 indicates a fourth diode sensor, 11a through 14a indicate first through fourth input terminals, 15a indicates a common terminal, 5-4 indicates a fourth chopper switch, 5-5 indicates a fifth chopper switch, and 7a through 7c indicate first through third dummy protection circuits.

[Modification]

Figure 11:
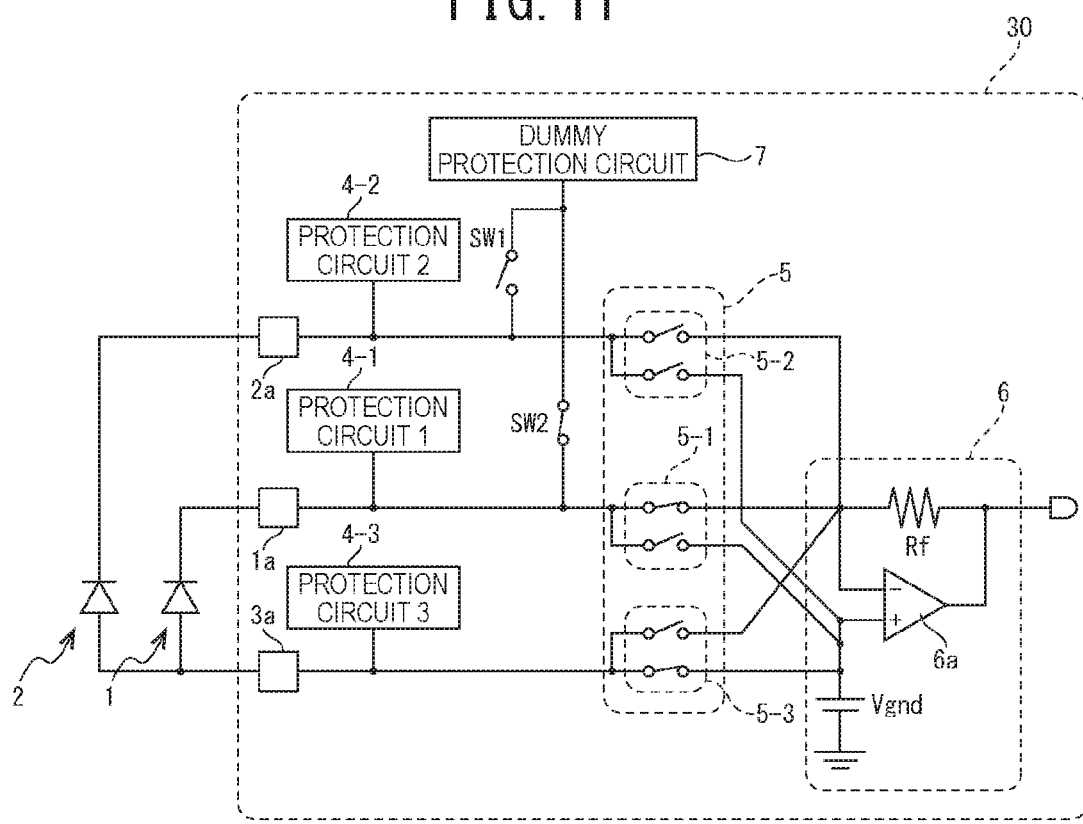
FIG. 11 is a circuit configuration diagram for describing a modification of the diode sensor device according to the present invention.

FIG. 11 is a circuit configuration diagram for describing a modification of the diode sensor device according to the present invention. In the present embodiment 1, there is illustrated the form in which the dummy protection circuit is connected to the input of the I-V conversion circuit, but may be a form equipped with a dummy protection circuit and switches SW1 and SW2 which switch whether or not to connect the dummy protection circuit to each PAD.

Alternatively, there may be a form in which a dummy protection circuit and a switch which switches whether or not to connect the dummy protection circuit to each PAD are provided in each PAD.

Also, although the form in which the anodes of the diode sensors are connected to each other is illustrated in the above description, there may be a form in which the cathodes of the diode sensors are connected to each other.

Further, although there is illustrated the form in which the anodes and cathodes of the diode sensors are respectively connected to each other, there may be a form in which an anode of a first diode sensor and a cathode of the second diode sensor are connected to each other, and an input terminal connected to the cathode of the first diode sensor and an input terminal connected to the anode of the second diode sensor are respectively provided.

That is, there is provided an output-current detection IC chip for diode sensors, which is equipped with one common terminal connected to one ends of N (N is an integer of 2 or more) of diode sensors, N input terminals connected to the other ends of the respective diode sensors, N+1 protection circuits connected to the N input terminals and the common terminal, a chopper circuit which switches the polarities of output currents of the respective diode sensors, an I-V conversion circuit which converts an output current from the chopper circuit into a voltage, and a current supplying unit which supplies a compensation current to the input of the I-V conversion circuit.

Further, there may be a form in which a wiring connected to anodes (or cathodes) of respective diode sensors is connected to a common terminal, even other than the form in which the anodes or cathodes of the diode sensors are directly connected to each other.

Thus, it is possible to realize a diode sensor device made so as to reduce the influence due to a leak current of each protection circuit without removing the protection circuit where a plurality of sensors are subjected to signal processing.

Embodiment 4

An output-current detection IC for a diode sensor of the present embodiment 4 is equipped with a photodiode infrared sensor, an I-V conversion circuit which converts an output current of the photodiode infrared sensor into a voltage, and a chopper circuit which switches the polarity of the output current of the photodiode infrared sensor inputted to the I-V conversion circuit.

Since in the output-current detection IC of the present embodiment 4, there is illustrated the configuration of switching the polarity of the output current of the diode sensor and inputting the same to the I-V conversion circuit and converting it into the voltage, it is hardly affected by the internal resistance of the diode sensor, and the influence of offset components of the circuit such as the I-V conversion circuit connected to the poststage of the diode sensor can be reduced. It is possible to reduce the residual offset components included in the first-stage I-V conversion circuit and detect an output current with satisfactory accuracy.

Further, by configuring the I-V conversion circuit so as to have an auto-zero amplifier and a feedback resistor, it is possible to reduce input offset components applied to the cathode and anode of the diode sensor and reduce a difference in output resistance of the photodiode sensor at the time of forward inversion and reverse inversion when chopper driving is done. It is therefore possible to reduce the residual offset and further improve detection accuracy.

FIGS. 12A and 12B are configuration diagrams for describing the embodiment 4 of the diode sensor device according to the present invention and is a diagram illustrating one example of the output-current detection IC.

The diode sensor device 101 in the present embodiment 4 is equipped with a diode sensor 102, an I-V conversion circuit 103 which converts an output current of the diode sensor 102 into a voltage, and a chopper circuit 104 which switches the polarity of the output current of the diode sensor 102, as illustrated in FIG. 12A.

Figure 13:
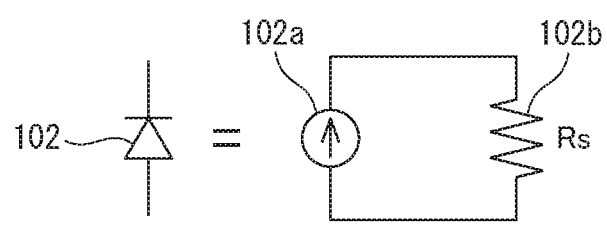
FIG. 13 is an equivalent circuit of a photodiode infrared sensor included in an infrared sensor.

The diode sensor 102 can be replaced with an equivalent circuit illustrated in FIG. 13. That is, the diode sensor 102 can be represented by a constant current source 102a (current value $I_L$) and an internal resistor 102b (resistance value Rs) connected in parallel to the constant current source 102a.

The chopper circuit 104 performs switching control (chopper control) to switch the diode sensor 102 to a forward connection and a reverse connection. Thus, it is possible to input the output current of the diode sensor 102 to the I-V conversion circuit 103 while switching its polarity.

The chopper circuit 104 is specifically connected between the cathode and anode of the diode sensor 102 and an input end of the I-V conversion circuit 103.

The chopper circuit 104 has a first switch unit 104a which switches the anode or cathode of the diode sensor 102 so as to connect to the input end of the I-V conversion circuit 103, and a second switch unit 104b which performs switching to supply a predetermined voltage to the cathode or anode of the photodiode sensor 102. That is, the first switch unit 104a is equipped with a switch sw1 connected between the cathode of the photodiode sensor 102 and an inversion input end in− of an amplifier 131 to be described later of the I-V conversion circuit 103, and a switch sw2 connected between the anode of the diode sensor 102 and the inversion input end in− of the amplifier 131. The second switch unit 104b is equipped with a switch sw3 connected between the cathode of the diode sensor 102 and a voltage source Vr1 which supplies a predetermined voltage, and a switch sw4 connected between the anode of the diode sensor 102 and the voltage source Vr1.

Then, as illustrated in the left circuit of FIG. 12A, the switch sw1, sw4 is turned ON, and the switch sw2, sw3 is turned OFF to thereby connect the cathode of the photodiode sensor 102 to the inversion input end in− and connect the anode to the voltage source Vr1 as illustrated in the right circuit of FIG. 12A (hereafter called forward inversion). Conversely, as illustrated in the left circuit of FIG. 12B, the switch sw1, sw4 is turned OFF, and the switch sw2, sw3 is turned ON to thereby connect the cathode of the diode sensor 102 to the voltage source Vr1 and connect the anode to the inversion input end in− as illustrated in the right circuit of FIG. 12(b) (hereinafter called reverse inversion).

These switches sw1~sw4 are operated in accordance with a chopper clock signal supplied from a chopper clock signal generating circuit 105.

The I-V conversion circuit 103 converts the output current of the diode sensor 102 into the voltage. Specifically, the I-V conversion circuit 103 is equipped with the amplifier 131 and a feedback resistor 132 (resistance value Rf). One end of the photodiode sensor 102 is connected to the inversion input end in− of the amplifier 131 through the chopper circuit 104, and the feedback resistor 132 (resistance value Rf) is connected between the inversion input end in− and an output end out of the amplifier 131. A non-inversion input end in+ of the amplifier 131 is connected to a voltage source Vr2 which supplies a predetermined voltage. The predetermined voltage supplied from the voltage source Vr2 is the same as the predetermined voltage supplied by the voltage source Vr1, which is supplied to the anode or cathode of the diode sensor 102.

The chopper clock signal generating circuit 105 supplies a chopper clock signal of a predetermined frequency to the switches sw1~sw4 to perform ON/OFF-control of these switches sw1~sw4. That is, the switches sw1 through sw4 are controlled such that the cathode or anode of the diode sensor 102 is connected to the inversion input terminal in− of the I-V conversion circuit 103, and the predetermined voltage is supplied to the anode or cathode of the diode sensor 102. Thus, the output current I of the diode sensor 102 is supplied to the I-V conversion circuit 103 while repeating forward inversion (I+) and reverse inversion (I−) alternately.

Specifically, at the time of the forward inversion, the chopper circuit 104 is switched in such a manner that the cathode of the diode sensor 102 is connected to the inversion input end in− of the I-V conversion circuit 103, and the predetermined voltage is supplied to the anode. On the other hand, at the time of the reverse inversion, the chopper circuit 104 is switched in such a manner that the anode of the diode sensor 102 is connected to the inversion input end in− of the I-V conversion circuit 103, and the predetermined voltage is supplied to the cathode. Thus, it is possible to switch the polarity of the output current of the diode sensor 102 and input the same to the I-V conversion circuit 103.

Thus, by switching the polarity of the output current of the diode sensor 102 before IV converting, the output current of the diode sensor 102 is modulated with a chopper frequency and inputted to the I-V conversion circuit 103, and a voltage signal converted into the voltage signal by the I-V conversion circuit 103 is outputted as an output signal of the diode sensor device 101.

An unillustrated posterior-stage arithmetic processing circuit of the diode sensor device 101 determines a difference between the output signals brought about by switching their polarities and obtains an input light detection value by the diode sensor 102 based on the result thereof to thereby make it possible to reduce the influence on the input light detection value by DC offset components of the circuits at the subsequent stage of the diode sensor 102 included in the diode sensor device 101, such as the I-V conversion circuit 103, the chopper circuit 104, etc. As a result, it is possible to detect the input light with satisfactory accuracy.

Further, since the output current of the diode sensor 102 is switched in polarity and inputted to the I-V conversion circuit 103, the influence of a variation in the internal resistance of the diode sensor 102 itself, or the like can also be reduced. Specifically, since the ratio between the feedback resistor 132 of the I-V conversion circuit 103 and the internal resistance affects an offset, an output offset of the I-V conversion circuit 103 varies when the internal resistance varies. Since, however, the polarity of the output current of the diode sensor 102 is switched as described above, even varied offset components can be canceled.

Figure 14:
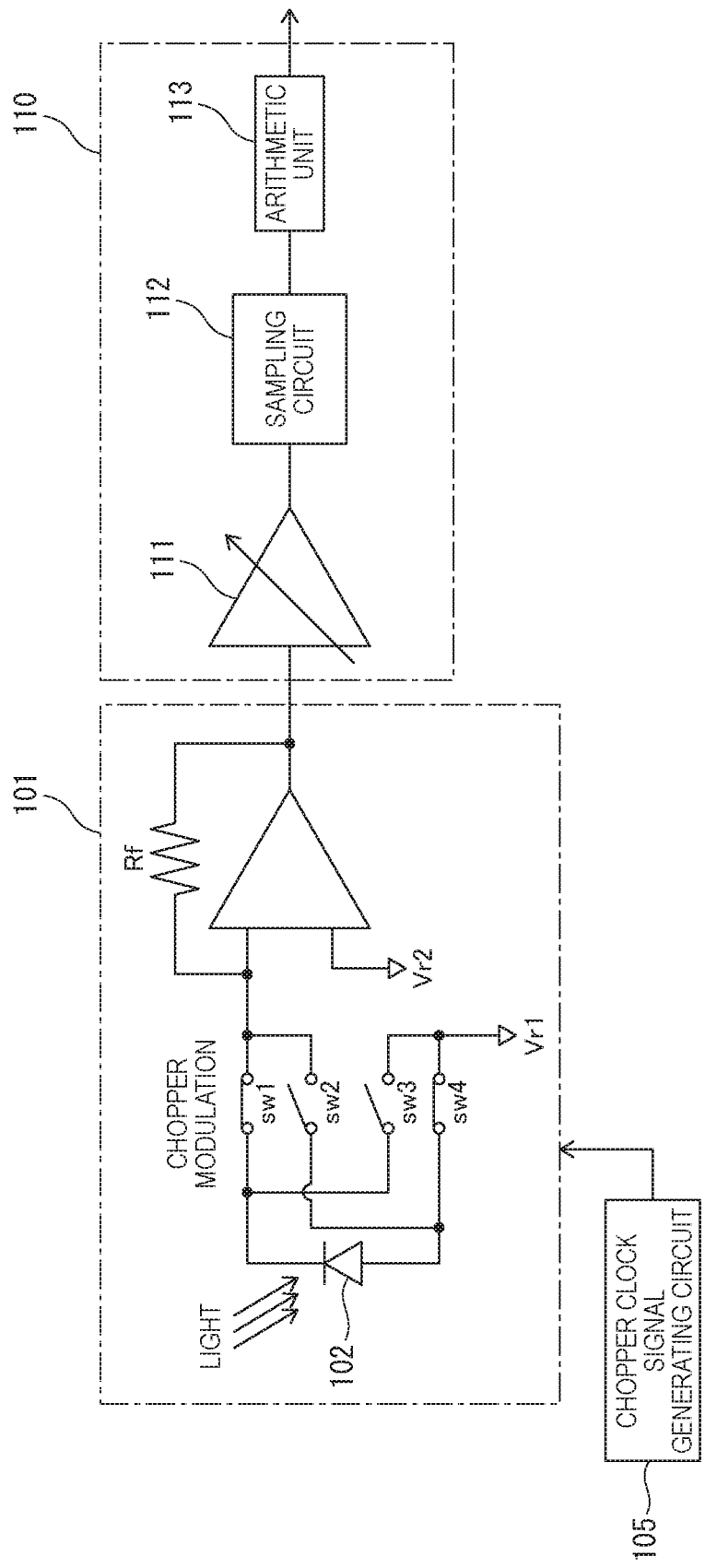
FIG. 14 is a configuration diagram illustrating one example of an arithmetic processing circuit which performs arithmetic processing, based on an output signal of the infrared sensor in FIG. 12.

FIG. 14 is a configuration diagram illustrating one example of an arithmetic processing circuit which calculates an input light detection value of a photodiode sensor on the basis of an output signal of an infrared sensor brought about by switching the polarity thereof.

The arithmetic processing circuit 110 is equipped with, for example, a variable amplifier circuit 111 which amplifies an output signal of the diode sensor comprised of a voltage signal switched in polarity, which is converted by an I-V conversion circuit 103, a sampling circuit 112 which samples the output signal amplified by the variable amplifier circuit 111, and an arithmetic unit 113 which calculates an input light detection value of the diode sensor 102, based on the output signal sampled by the sampling circuit 112.

In the arithmetic unit 113, for example, an output signal corresponding to the output current of the photodiode sensor 102 at the time of forward inversion, which is sampled by the sampling circuit 112, and an output signal corresponding to the output current of the diode sensor 102 at the time of reverse inversion are inputted alternately. Then, a difference between the output signal at the time of the forward inversion and the output signal at the time of the reverse inversion is calculated and defined as the input light detection value of the diode sensor 102.

Incidentally, the processing in the arithmetic unit 113 is not limited to the above. The input light detection value of the diode sensor 102 during a fixed period may be calculated on the basis of a plurality of output signals at the time of the forward inversion and a plurality of output signals at the time of the reverse inversion within the above-described fixed period. Further, when the input light detection value of the diode sensor 102 for the fixed period is calculated on the basis of the plural output signals at the time of the forward inversion and the plural output signals at the time of the reverse inversion for the fixed period, it is not limited to the case where the polarity of the output current of the diode sensor 102 is switched alternately. The polarity may be switched for every twice as in, for example, "forward inversion, forward inversion, reverse inversion, and reverse inversion". When the number of the output currents at the time of the forward inversion and the number of the output currents at the time of the reverse inversion for the fixed period are the same number, the polarity may be switched in any pattern.

Further, there is not limited to the above-described form, but may be a form in which a sample-hold circuit which performs the operation of inputting the output voltage of the I-V conversion circuit 103 as it is at the time of the forward inversion and inputting it at a gain of "−1 times" at the time of the reverse inversion is provided to thereby take a difference between an output signal at the time of the forward inversion and an output signal at the time of the reverse inversion.

Embodiment 5

A description will next be made about an embodiment 5 of a diode sensor device according to the present invention.

A description will first be made about an operation example of the diode sensor device in the embodiment 4 described above.

Figure 15A:
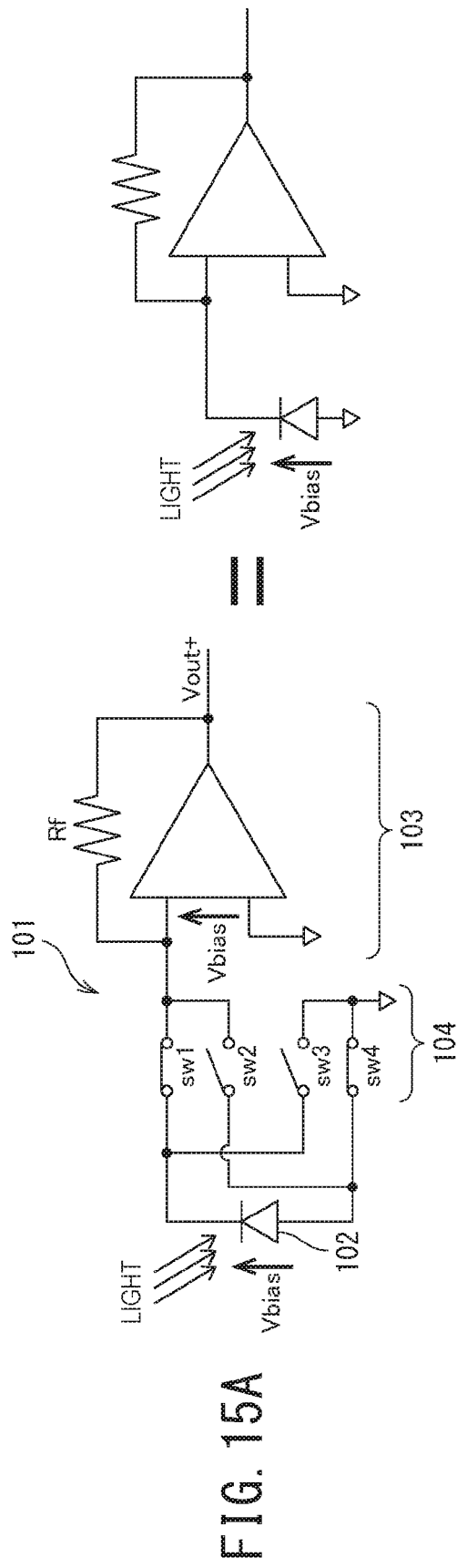
FIGS. 15A and 15B are conceptual diagrams for describing an operation example of the infrared sensor in the embodiment 4.
Figure 15B:
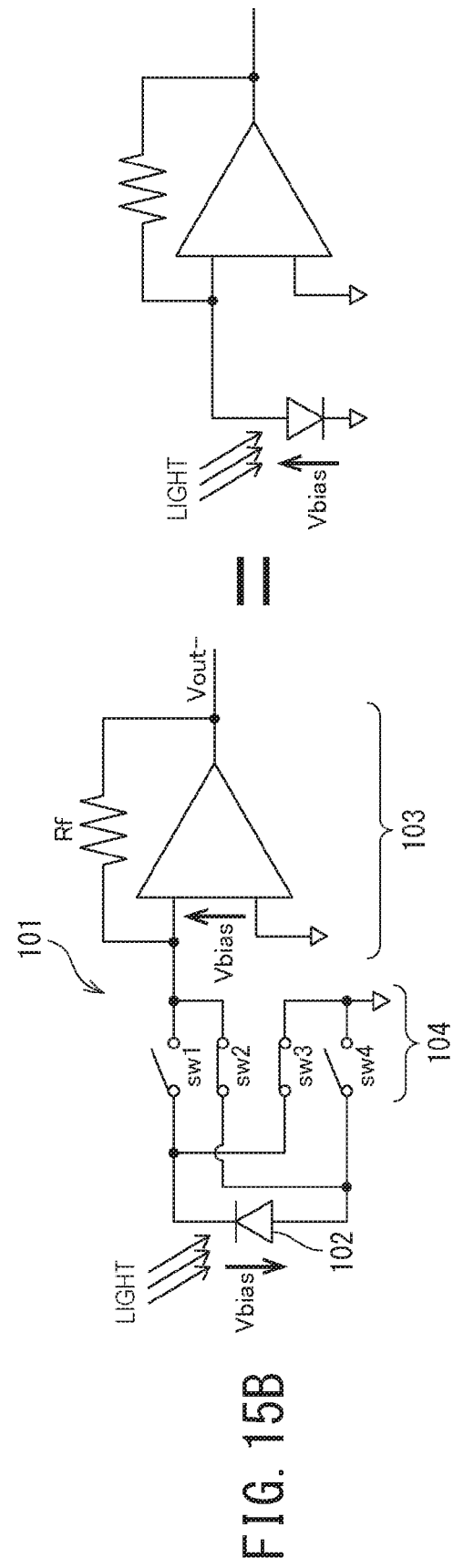

FIGS. 15A and 15B are conceptual diagrams of the diode sensor device in the embodiment 4 illustrated in FIGS. 12A and 12B.

Here, in the diode sensor device 101 in the embodiment 4, as illustrated in FIGS. 15A and 15B, a case in which an input offset voltage Vbias exists in the I-V conversion circuit 103 is assumed. Incidentally, in FIGS. 15A and 15B, FIG. 15A illustrates the time of forward inversion, and FIG. 15B illustrates the time of reverse inversion. Also, in FIGS. 15A and 15B, the left circuit represents a switch state, and the right circuit is one in which a circuit configuration is simplified.

Figure 16A:
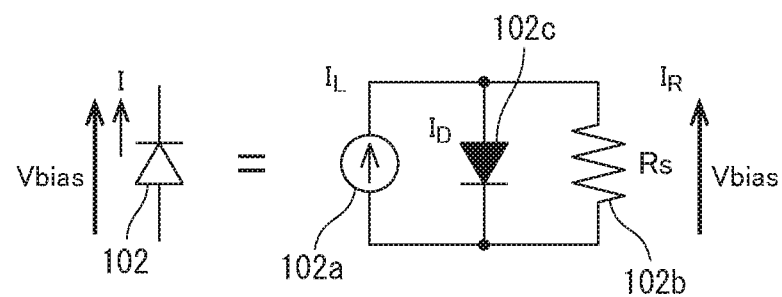
FIGS. 16A and 16B are equivalent circuits of a photodiode infrared sensor included in the infrared sensor.
Figure 16B:
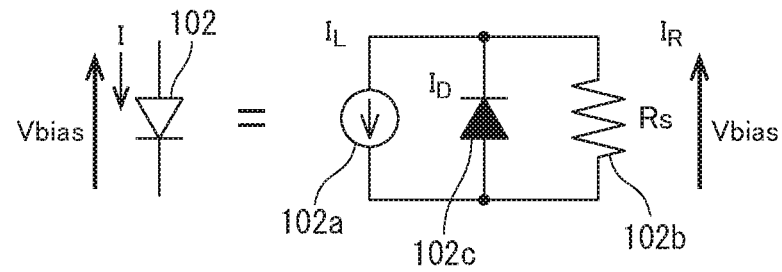

In the diode sensor device 101 in the embodiment 4 described above, when the input offset voltage Vbias exists in the I-V conversion circuit 103, the input offset voltage Vbias is applied between the cathode and anode of the diode sensor 102. At this time, the photodiode sensor 102 can be replaced with an equivalent circuit illustrated in FIGS. 16A and 16B. Incidentally, FIG. 16A is taken at the time of the forward inversion, and FIG. 16B is an equivalent circuit at the time of the reverse inversion.

That is, the diode sensor 102 can be represented by a constant current source 102a, an internal resistor 102b connected in parallel to the constant current source 102a, and a diode 102c connected in parallel to the constant current source 102a and the internal resistor 102b.

When a light input is given to the diode sensor 102 represented by such an equivalent circuit, the output current I of the diode sensor 102 is derived by the following equation (13):

$$I = I_L - I_D - I_R \qquad \text{Equation (13)}$$

In the equation (13), $I_L$ indicates a generated current based on the light input, $I_D$ indicates an output current of the diode 102c by application of the input offset voltage Vbias in reverse polarity, and $I_D$ indicates a current generated by the resistance value Rs of the internal resistor 102b of the photodiode sensor 102 and the input offset voltage Vbias applied to the diode sensor 102.

$I_D$ in the equation (13) is represented by an equation (14) described below:

$$I_D = I_0 \times [\exp(qV/kT) - 1] \qquad \text{Equation (14)}$$

In the equation (14), $I_0$ is a reverse saturation current of the diode sensor 102, q is a charge amount of the diode sensor 102, V is a voltage (Vbias) applied between the anode and cathode of the photodiode sensor 102, k is the Boltzmann coefficient, and T is the absolute temperature.

$I_D$ in the equation (13) is represented by the following equation (15):

$$I_R = V/Rs \qquad \text{Equation (15)}$$

In the equation (15), V is a voltage (Vbias) applied between the anode and cathode of the diode sensor 102, and Rs is the resistance value of an internal parallel resistor (internal resistor).

Here, in the diode sensor device 101 illustrated in FIGS. 15A and 15B, an input offset (a few mV or so) of the I-V conversion circuit 103 comprised of an op amplifier exists in an input stage, and Vbias is determined by this offset voltage.

When the diode sensor 102 is switched (chopper-controlled) between the forward connection (forward inversion) and the reverse connection (reverse inversion) by the chopper circuit 104, $I_D$ is inconsistent in magnitude (current amount) when in the forward and reverse directions from the above equation (14) as described below because the polarity of Vbias becomes opposite.

Equation (14) when in the forward direction: $I_{D+} = I_0 \times [\exp(qVbias/kT) - 1]$ Equation (14) when in the reverse direction: $I_{D-} = I_0 \times [\exp(q(-Vbias)/kT) - 1]$ Incidentally, since $I_L$ in the equation (13) depends on the light quantity of the input light, the current amount does not change even if the connection is switched by the chopper control. $I_S$ is as expressed in the equation (15), and the amount of the current does not change even if the connection is switched.

Further, as to $I_R$ of the equation (13), even if switching is done by the chopper control, the amount of the current does not change because the values of Vbias and $R_S$ do not change.

Here, for the sake of simplicity, consider $I_L$ to be a non-input state free of an external input such as light ($I_L = 0$).

An output Vout after I-V conversion is represented by the following equation (16) from the resistance value Rf of the feedback resistor 132 of the I-V conversion circuit 103:

$$Vout = (-I_D - I_R) \times Rf \qquad \text{Equation (16)}$$

Accordingly, Vout$_+$ at the connection in the forward direction and Vout$_-$ at the connection in the reverse direction are as expressed in the following equations (17) and (18):

$$Vout_+ = (-I_{D+} - I_R) \times Rf \qquad \text{Equation (17)}$$

$$Vout_- = (-I_{D-} - I_R) \times Rf \qquad \text{Equation (18)}$$

From the equations (17) and (18), it is found that the difference (demodulation) between Vout$_+$ at the connection in the forward direction and Vout$_-$ at the connection in the reverse direction does not become "0" and remains as an offset (following equation (19)). This becomes the residual offset.

$$Vout_+ - Vout_- = (-I_{D+} + I_{D-}) \times Rf \neq 0 \qquad \text{Equation (19)}$$

That is, although the equation (14) is taken as the output and those amplified with conversion gain determined by Rf are respectively outputted, the value of the equation (14) changes before and after chopper in terms of the value, and hence the difference therebetween appears as an offset component.

Further, the equation (14) depends on the temperature because it includes the absolute temperature T, thus resulting in the influence on the accuracy. Therefore, when the output current of the diode sensor 102 is a micro-current output of several nA~several pA, there is particularly a case where the effect of offset cancel cannot be expected.

The infrared sensor in the embodiment 5 is intended to achieve the above-described offset cancel.

Figure 17A:
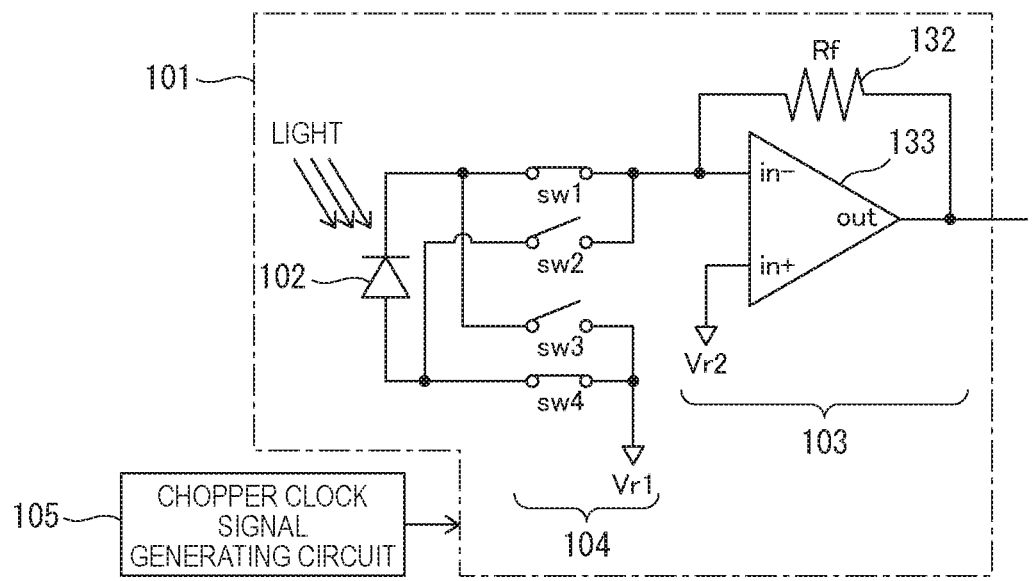
FIGS. 17A and 17B are configuration diagrams for describing an embodiment 5 of a diode sensor device according to the present invention, and is a diagram illustrating one example of the infrared sensor.
Figure 17B:
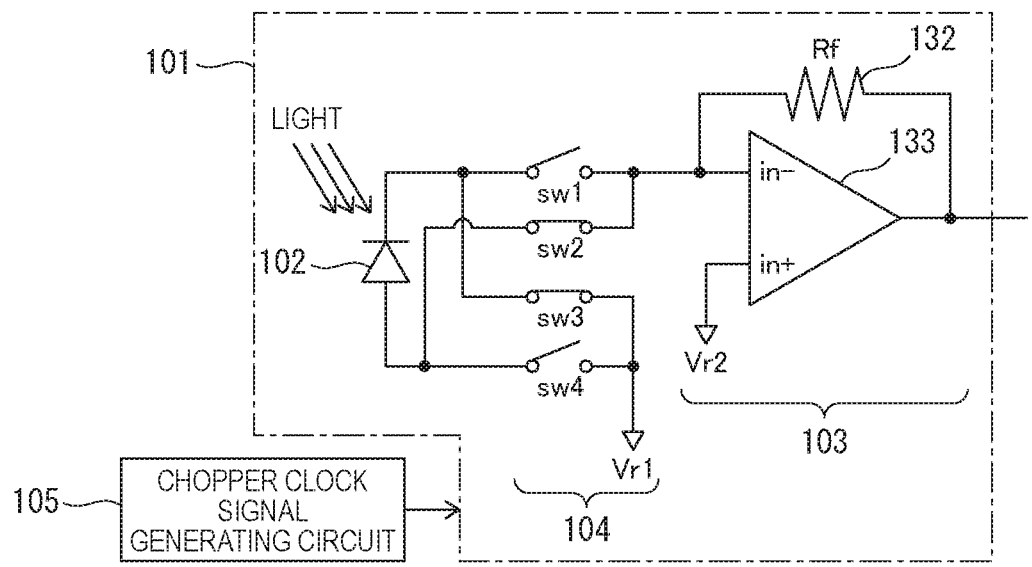

FIGS. 17A and 17B are configuration diagrams for describing the embodiment 5 of the diode sensor device according to the present invention and is a diagram illustrating one example of the infrared sensor.

The infrared sensor 101 in the present embodiment 5 is equipped similarly to the infrared sensor in the above-described embodiment 4, with a diode sensor 102, an I-V conversion circuit 103 which converts an output current of the diode sensor 102 into a voltage, and a chopper circuit 104 which switches the polarity of the output current of the diode sensor 102. In the infrared sensor 101 in the present embodiment 5, however, the I-V conversion circuit 103 is equipped with an auto-zero amplifier 133 and a feedback resistor 132 (resistance value Rf). Further, the chopper circuit 104 is controlled by a chopper clock signal generating circuit 105.

Incidentally, FIG. 17A illustrates the time of forward inversion, and FIG. 17B illustrates a circuit state at the time of reverse inversion.

This auto-zero amplifier 133 is comprised of an auto-zero amplifier small in input offset (for example, several 10 μV or less). One end of the diode sensor 102 is connected to an inversion input end in− of the auto-zero amplifier 133 through the chopper circuit 104, and the feedback resistor 132 (resistance value Rf) is connected between the inversion input end in− of the auto-zero amplifier 133 and an output end out. A non-inversion input end in+ of the auto-zero amplifier 133 is connected to a voltage source Vr2 which supplies a predetermined voltage. The predetermined voltage supplied from the voltage source Vr2 is identical to a predetermined voltage supplied by a voltage source Vr1, which is supplied to an anode or a cathode of the photodiode sensor 102. Incidentally, for example, an auto-zero amplifier illustrated in FIG. 19 to be described later can be applied as the auto-zero amplifier 133.

The chopper clock signal generating circuit 105 supplies a chopper clock signal of a predetermined frequency to switches sw1~sw4 to perform ON/OFF-control of these switches sw1~sw4, and controls the switches sw1 through sw4w such that the cathode or anode of the photodiode sensor 102 is connected to the inversion input terminal in− of the I-V conversion circuit 103, and the predetermined voltage Vr1 is supplied to the anode or cathode of the diode sensor 102. Thus, the output current I of the photodiode sensor 102 is supplied to the I-V conversion circuit 103 while repeating forward inversion (I+) and reverse inversion (I−) alternately.

In the present embodiment 5, there is illustrated the configuration in which the auto-zero amplifier small in input offset and the feedback resistor are provided in the I-V conversion circuit 103.

Therefore, the input offset is small. Thus, an approximation to $qV/kT \approx 0$ can be taken in the above-described equation (14), the output current I can be approximated to the following equation (20) when no input is done:

$$I \approx -I_R = -V/Rs \quad \text{Equation (20)}$$

Accordingly, in the present embodiment 5, $\text{Vout}_+$ at the connection in the forward direction and $\text{Vout}_-$ at the connection in the reverse direction are as expressed in the following equations (21) and (22). An offset component can be canceled by taking (demodulating) a difference therebetween.

$$\text{Vout}_+ = -V/Rs \quad \text{Equation (21)}$$

$$\text{Vout}_- = -V/Rs \quad \text{Equation (22)}$$

Thus, the difference (demodulation) between $\text{Vout}_+$ at the connection in the forward direction and $\text{Vout}_-$ at the connection in the reverse direction can be approximated to "0" (following equation (23)):

$$\text{Vout}_+ - \text{Vout}_- \approx -V/Rs + V/Rs = 0 \quad \text{Equation (23)}$$

As above, for the sake of simplicity, the output of the I-V conversion circuit 103 in a non-input state is considered, but the offset component can be canceled similarly even when light is inputted.

For example, when there is a light input, the above equation (20) becomes the following equation (24):

$$I \approx I_L - V/Rs \quad \text{Equation (24)}$$

Thus, $\text{Vout}_+$ at the connection in the forward direction and $\text{Vout}_-$ at the connection in the reverse direction are as expressed in the following equations (25) and (26):

$$\text{Vout}_+ = I_L - V/Rs \quad \text{Equation (25)}$$

$$\text{Vout}_- = -I_L - V/Rs \quad \text{Equation (26)}$$

Thus, by taking (demodulating) a difference therebetween to cancel an offset component, it is possible to take out only the equivalent of the output current of the diode sensor 102 (equation (27)).

$$\text{Vout}_+ - \text{Vout}_- = 2I_L \quad \text{Equation (27)}$$

Further, there is a possibility that the resistance value Rs of the internal resistor (parallel resistor) 102b of the diode sensor 102 will vary due to aging. The variation in the resistance value Rs of the internal resistor 102b specifically appears as a variation in the output voltage of the first-stage amplifier. It is represented by the product of gain determined by the ratio between the resistance value Rs of the internal resistor 102b and the feedback resistor and the input offset voltage of the amplifier. In the present embodiment 5, the influence of the variation due to aging in the resistance value Rs of the internal resistor 102b of the diode sensor 102 can also be canceled.

As described above, by using the auto-zero amplifier small in input offset voltage in the I-V conversion circuit 103, the offset current components before and after the switching (chopper control) of the polarity of the output current of the diode sensor 102, which are included in the input light detection value can be reduced. It is possible to reduce the residual offset component included in the first-stage I-V conversion circuit and detect the output current with satisfactory accuracy.

Thereby, as illustrated in FIG. 14, in the case where demodulation is performed in the subsequent stage of the infrared sensor 101 (when the difference between before and after the polarity is taken), it is possible to reduce the residual offset and detect the input light with satisfactory accuracy.

[Modification]

Although the infrared sensor 101 equipped with the diode sensor 102, the I-V conversion circuit 103 which converts the output current of the diode sensor 102 into the voltage, and the chopper circuit 104 which switches the polarity of the output current of the diode sensor 102 and inputs the same to the I-V conversion circuit 103 has been described in the embodiment 4 or the embodiment 5 described above, the chopper clock signal generating circuit 105 may further be provided in the infrared sensor 101.

Further, in the infrared sensor 101 in the embodiment 4 or the embodiment 5 described above, an infrared sensor signal processing IC chip may be configured which is equipped with an I-V conversion circuit 103 and a chopper circuit 104 which process an output current of a photodiode sensor 102, a chopper clock signal generating circuit 105 which supplies a chopper clock signal to the chopper circuit 104, and a predetermined voltage generating circuit 106 which supplies a predetermined voltage.

Figure 18:
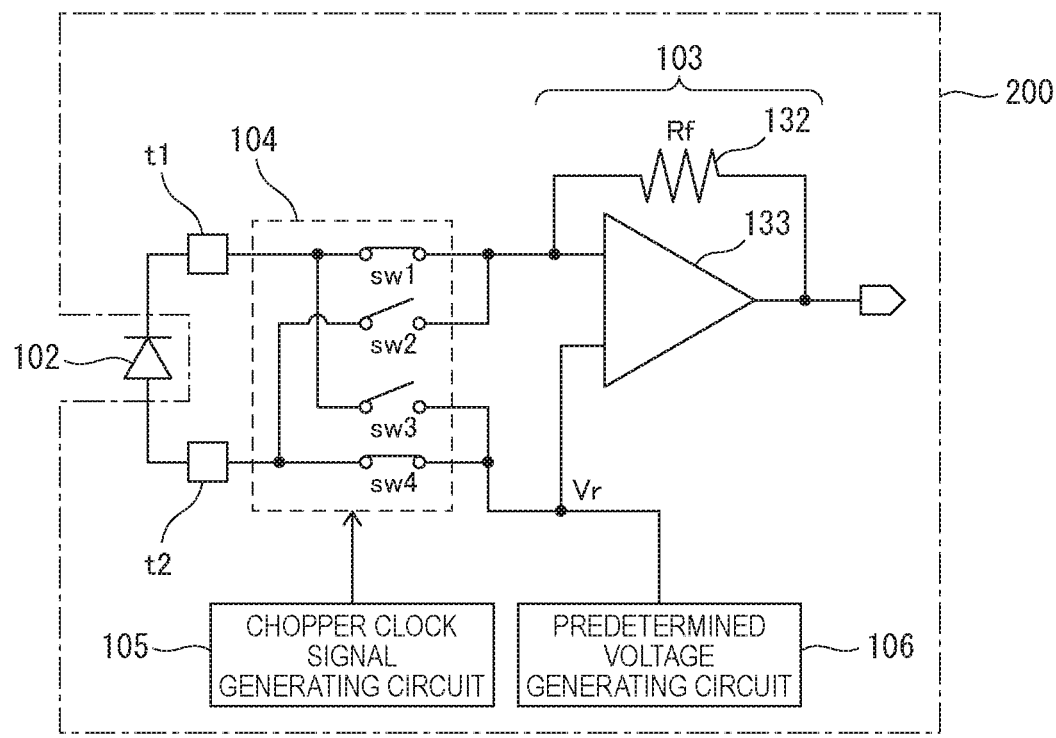
FIG. 18 is a configuration diagram illustrating one example of an infrared sensor signal processing IC chip.

FIG. 18 is a diagram illustrating one example of the infrared sensor signal processing IC chip. A description will be made about the case where an infrared sensor signal processing IC chip 200 is configured using the infrared sensor signal processing unit in the embodiment 5 equipped with the auto-zero amplifier 133.

As illustrated in FIG. 18, the infrared sensor signal processing IC chip 200 is equipped with a first input terminal t1 connected to an anode of the diode sensor 102, a second input terminal t2 connected to a cathode of the diode sensor 102, an I-V conversion circuit 103 which converts an output current of the diode sensor 102 into a voltage, a chopper circuit 104 which switches the polarity of the output current of the diode sensor 102 and inputs the same to the above-described I-V conversion circuit 103, a chopper clock signal generating circuit 105 which supplies a chopper clock single to respective switches sw1 sw4 of the chopper circuit 104, and a predetermined voltage generating circuit 106 which supplies a predetermined voltage to the first input terminal t1 or the second input terminal t2.

Incidentally, although the description has been made in FIG. 18 about the case where the infrared sensor signal processing IC chip 200 equipped with the chopper clock signal generating circuit 105 is configured, it is not always necessary to provide the chopper clock signal generating circuit 105 in the infrared sensor signal processing IC chip 200. It may be configured that the chopper clock signal is supplied from the chopper clock signal generating circuit 105 provided outside the infrared sensor signal processing IC chip 200 to the chopper circuit 104.

The I-V conversion circuit 103 has an auto-zero amplifier 133 and a feedback resistor 132 (resistance value Rs). A predetermined voltage Vr is supplied to a non-inversion input terminal of the auto-zero amplifier 133.

Figure 19:
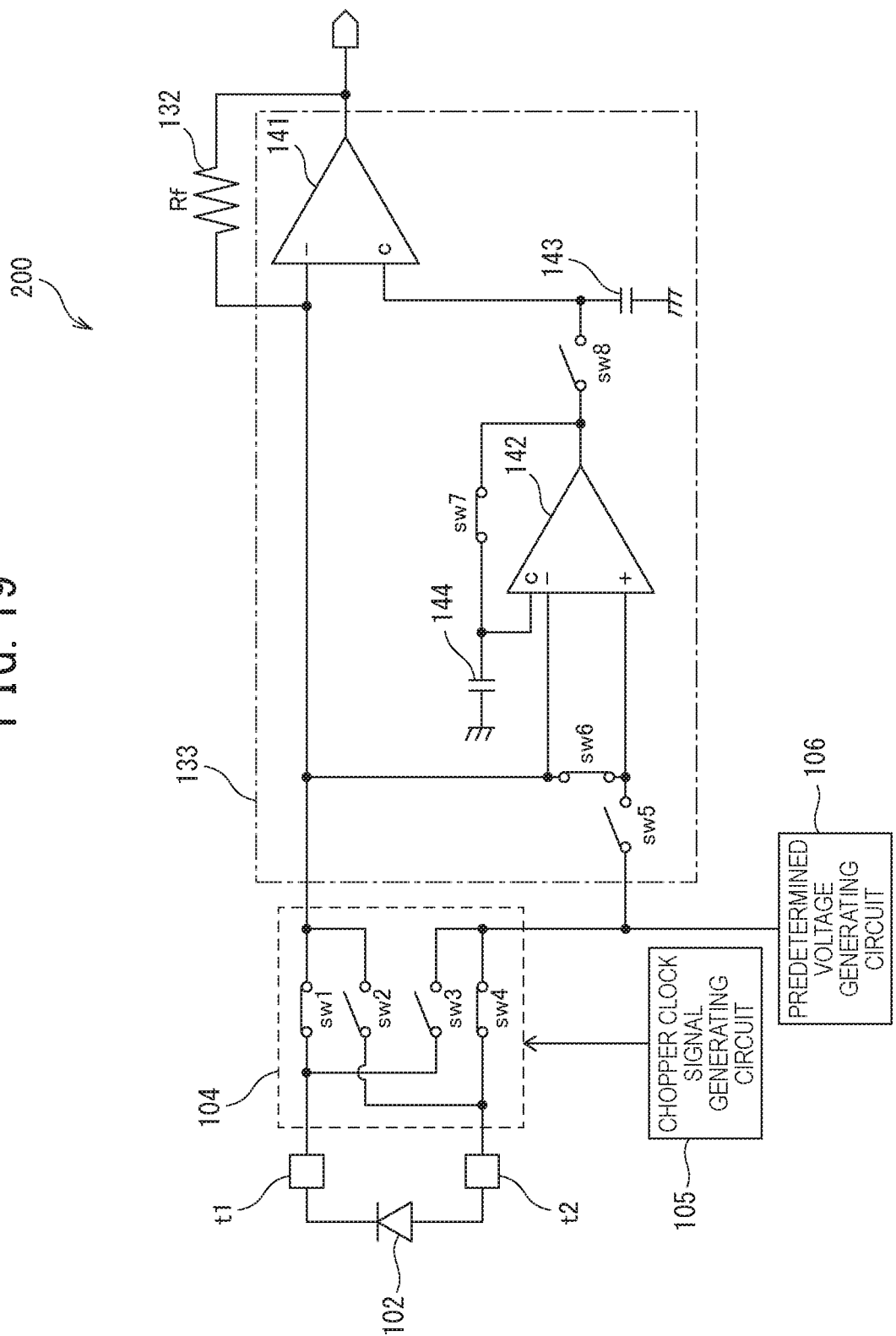
FIG. 19 is a configuration diagram illustrating one example of an auto-zero amplifier.

FIG. 19 is a diagram illustrating a specific example of an auto-zero amplifier included in an infrared sensor signal processing IC chip.

The auto-zero amplifier 133 is equipped with a main amplifier 141 and a zero adjustment amplifier 142 as illustrated in FIG. 19. A feedback resistor 132 is connected between an output end and an inversion input end of the main amplifier 141. Further, the inversion input end of the main amplifier 141 is connected to a cathode of a diode sensor 102 through a chopper circuit 104 and a first input terminal t1. A zero adjustment input end c of the main amplifier 141 is grounded through a capacitor 143.

An output end of the zero adjustment amplifier 142 is connected to the zero adjustment input end c of the main amplifier 141 through a switch sw8 and connected to a zero adjustment input end c of the zero adjustment amplifier 142 through a switch sw7. Further, the output end of the zero adjustment amplifier 142 is grounded via a capacitor 144 through the switch sw7.

An inversion input end of the zero adjustment amplifier 142 is connected to the cathode of the photodiode sensor 102 through the chopper circuit 104 and the first input terminal t1 and connected to the first input terminal t1 or a second input terminal t2 through switch sw6, sw5 and a chopper circuit 104. A non-inversion input end of the zero adjustment amplifier 142 is connected to the first input terminal t1 or the second input terminal t2 through the switch sw5 and the chopper circuit 104.

A predetermined voltage Vr generated by a predetermined voltage generating circuit 106 is supplied to the first input terminal t1 or the second input terminal t2 through a switch sw3 or sw4 and supplied to the first input terminal t1 or the second input terminal t2 through the auto-zero amplifier 133 and switch sw1, sw2. Further, the predetermined voltage Vr is supplied to the non-inversion input end of the zero adjustment amplifier 142 through the switch sw5.

Then, the switches sw1 sw4 are operated based on a chopper clock signal from a chopper clock signal generating circuit 105 to thereby switch to a state of connecting the diode sensor 102 to the I-V conversion circuit 103 in the forward direction by the chopper circuit 104 or a state of connecting the same thereto in the reverse direction by the chopper circuit 104. That is, the chopper circuit 104 switches between a state of connecting the first input terminal t1 to an input end of the auto-zero amplifier 133 and supplying the predetermined voltage Vr to the second input terminal t2 and a state of connecting the second input terminal t2 to an input end of the auto-zero amplifier 133 and supplying the predetermined voltage Vr to the first input terminal t1. Thus, the output current of the diode sensor 102 is switched in polarity and inputted to the I-V conversion circuit 103.

Then, the auto-zero amplifier 133 is operated in two phases every clock cycle. In the phase 1, a signal to be inputted to the auto-zero amplifier 133 is supplied only to the main amplifier 141 and a voltage stored in the capacitor 143 is applied to the zero adjustment input end c of the main amplifier 141, and at the same time, the zero adjustment amplifier 142 applies its own zero adjustment voltage to the capacitor 144. In the phase 2, the zero adjustment amplifier 142 amplifies the input voltage applied to the inversion input terminal of the main amplifier 141 using the zero adjustment voltage from the capacitor 144 and supplies the amplified voltage to the zero adjustment input end c of the main amplifier 141 and the capacitor 144.

Thus, the zero adjustment amplifier 142 is operated in such a manner that a voltage necessary to set an input difference voltage of the main amplifier 141 to a numeric value close to zero is obtained at the zero adjustment input end c of the main amplifier 141, and adjusts the offset of the main amplifier 141 to be zero.

FIGS. 20A-20H are diagrams illustrating a timing chart illustrating the operations of the auto-zero amplifier and the chopper switches of the chopper circuit in the infrared sensor signal processing IC chip illustrated in FIG. 19.

Incidentally, in terms of a magnitude relationship between a chopper frequency of the chopper circuit 104 and an operating frequency of the auto-zero amplifier 133, the chopper frequency may be larger or smaller than the operating frequency of the auto-zero amplifier 133.

In FIGS. 20A-20H, FIGS. 20A-20D illustrate the operations of the respective switches sw1 sw8 in the chopper circuit 104 and the auto-zero amplifier 133 when the chopper frequency of the chopper circuit 104>the auto-zero amplifier operating frequency.

In FIGS. 20A-20H, FIG. 20A represents the operation of the switch sw1, sw4, FIG. 20B represents the operation of the switch sw2, sw3, FIG. 20C represents the operation of the switch sw5, sw8, and FIG. 20D represents the operation of the switch sw6, sw7.

First, in the auto-zero amplifier 133, the switches sw5 and sw8 are turned OFF and the switches sw6 and sw7 are turned ON. This interval corresponds to the above-described phase 1 and is an interval during which an offset voltage is adjusted. Incidentally, during the interval of the phase 1, the switch sw1, sw4 of the chopper circuit 104 is turned OFF, and the switch sw2, sw3 thereof is turned ON.

Thereafter, the switches sw5 and sw8 of the auto-zero amplifier 133 are turned ON, and the switches sw6 and sw7 are turned OFF. This interval corresponds to the above-described phase 2 and is an interval during which a result of adjustment of the offset voltage is held. During this interval, the switches sw1~sw4 of the chopper circuit 104 are switched to perform chopper driving. In FIGS. 20A and 20B, there is illustrated the form of repeating forward inversion and reverse inversion by twice alternately during the interval corresponding to the phase 2.

When the number of times of the forward inversion and the number of times of the reverse inversion are the same, there may be a form in which chopper driving is performed plural times. As described above, the forward inversion and the reverse inversion may be repeated by plural sets with "twice for the forward inversion and twice for the reverse inversion" as one set to perform chopper driving. Further, when the chopper driving is performed, either of the switch sw1, sw4 and the switch sw2, sw3 may first be turned ON.

Further, as to the output signals of the I-V conversion circuit 103 during the interval at which the forward inversion and the reverse inversion are repeated, the difference between the output signal at the time of the forward inversion and the output signal at the time of the reverse inversion is determined by, for example, the arithmetic unit 113 included in the arithmetic processing circuit 110 illustrated in FIG. 14, which is connected to the subsequent stage of the infrared sensor signal processing IC chip 200, thereby making it possible to reduce the difference in the output resistance of the diode sensor 102 and remove even the DC offset components of the circuits at the subsequent stage of the diode sensor 102, such as the I-V conversion circuit 103, etc.

Accordingly, the chopper frequency at which the chopper circuit 104 is chopper-driven, the operating frequency of the auto-zero amplifier 133, the sampling frequency of the sampling circuit 112 included in the arithmetic processing circuit 110 illustrated in FIG. 14, for example, which is connected to the subsequent stage of the infrared sensor signal processing IC chip 200, etc. are preferably synchronized.

Thereafter, when the interval of the phase 1 is reached again, the switch sw5, sw8 becomes OFF, and the switch sw6, sw7 becomes ON in the auto-zero amplifier 133, so that the offset voltage is adjusted. On the other hand, the switch sw1, sw4 of the chopper circuit 104 becomes OFF, and the switch sw2, sw3 becomes ON. Incidentally, in FIGS. 20A-20H, since the switch sw1, sw4 becomes OFF, and the switch sw2, sw3 becomes ON in the phase 2 immediately before switching to the phase 1, the switch sw1, sw4 is held OFF, and the switch sw2, sw3 is held ON upon switching from the phase 2 to the phase 1 in the chopper circuit 104.

In FIGS. 20A-20H, FIGS. 20E-20H represent the operations of the respective switches sw1 sw8 in the chopper circuit 104 and the auto-zero amplifier 133 when the chopper frequency of the chopper circuit 104<the auto-zero amplifier operating frequency. FIG. 20E illustrates the operation of the switch sw1, sw4, FIG. 20F illustrates the operation of the switch sw2, sw3, FIG. 20G illustrates the operation of the switch sw5, sw8, and FIG. 20H illustrates the operation of the switch sw6, sw7.

First, in the auto-zero amplifier 133, the switch sw5 and sw8 are turned OFF, and the switches sw6 and sw7 are turned ON. This interval corresponds to the above-described phase 1 and is an interval during which the offset voltage is adjusted.

Next, the switches sw5 and sw8 are turned ON, and the switches sw6 and sw7 are turned OFF. This interval corresponds to the above-described phase 2 and is an interval during which a result of adjustment of the offset voltage is held.

Next, again, the switches sw5 and sw8 become OFF, and the switches sw6 and sw7 become ON. This results in an interval of the phase 1, which is an interval during which the offset voltage is adjusted.

Thereafter, the switches sw5 and sw8 become ON, and the switches sw6 and sw7 become OFF. This results in an interval of the phase 2, and a result of adjustment of the offset voltage is held.

On the other hand, in the chopper circuit 104, first, the switches sw1 and sw4 become OFF, and the switches sw2 and sw3 become ON. The ON/OFF is repeated alternately with the timing for switching from the phase 2 to the phase 1 from this state.

Then, when the switch sw1, sw4 becomes ON, and the switch sw2, sw3 becomes OFF, the output current of the diode sensor 102 is outputted to the I-V conversion circuit 103 as it is. That is, the output current at the time of the forward inversion is outputted to the I-V conversion circuit 103. Conversely, when the switch sw1, sw4 becomes OFF, and the switch sw2, sw3 becomes ON (FIG. 19), the output current of the photodiode sensor 102 is inverted and outputted to the I-V conversion circuit 103. That is, the output current at the time of the reverse inversion is outputted to the I-V conversion circuit 3.

Then, the difference between the output signal of the I-V conversion circuit 103 at the time of the forward inversion and the output signal of the I-V conversion circuit 103 at the time of the reverse inversion during the interval of the phase 2 is determined by, for example, the arithmetic unit 113 included in the arithmetic processing circuit 110 illustrated in FIG. 14, which is connected to the subsequent stage of the infrared sensor signal processing IC chip 200, thereby making it possible to reduce the difference in the output resistance of the diode sensor 102 and remove even the DC offset components of the circuits at the subsequent stage of the diode sensor 102, such as the I-V conversion circuit 103, etc.

Incidentally, at this time, the sampling circuit 112 included in the arithmetic processing circuit 110 connected to the subsequent stage of the infrared sensor signal processing IC chip 200 is set to the form of sampling except for the interval during which the offset voltage in the phase 1 is adjusted. Thus, by determining the difference by the arithmetic unit 113 included in the subsequent-stage arithmetic processing circuit 110, the difference in the output resistance of the diode sensor 102 can be reduced, and the DC offset components of the circuits at the subsequent stage of the diode sensor 102, such as the I-V conversion circuit 103, etc. can also be removed.

Incidentally, in the above-described embodiment, although a description has been made about the case where the infrared sensor signal processing IC chip 200 which performs signal processing on one diode sensor 102, is configured, it is also possible to configure an infrared sensor signal processing IC chip 200 which performs signal processing on plural diode sensors 102. For example, there may be a configuration that the above-described chopper circuit 104 and I-V conversion circuit 103 are respectively provided corresponding to plural photodiode sensors 102. Alternatively, there may be a configuration that time division processing is performed on plural diode sensors 102 by the above-described chopper circuit 104 respectively corresponding to the diode sensors 102, and one I-V conversion circuit 103.

Further, in the present embodiment 4, there may be a configuration provided with the dummy protection circuit of the present embodiment 1.

While the present invention has been described with reference to the particular embodiments as described above, these descriptions are not intended to limit the invention. Other embodiments of the present invention will also be apparent to those skilled in the art along with various modifications of the disclosed embodiments by reference to the description of the present invention. Accordingly, it should be understood that the appended claims will also cover these modifications or embodiments included in the technical scope and gist of the present invention.

REFERENCE SIGNS LIST 1, 2, 3, 4 diode sensor
1a, 2a, 11a through 14a input terminal (PAD)
3a, 15a common terminal (PAD)
4-1 through 4-5 protection circuits (ESD protection circuit)
5 chopper circuit 5-1 through 5-5 chopper switches
6 I-V conversion circuit
6a amplifier
7 dummy protection circuit (dummy ESD protection circuit)
10 sensor unit
20, 30 output-current detection IC chip
101 diode sensor device (infrared sensor)
102 photodiode infrared sensor
102a constant current source
102b internal resistor
103 I-V conversion circuit
104 chopper circuit
105 chopper clock signal generating circuit
106 predetermined voltage generating circuit
110 arithmetic processing circuit
111 variable amplifier circuit
112 sampling circuit
113 arithmetic unit 131 amplifier
132 feedback resistor
133 auto-zero amplifier
200 infrared sensor signal processing IC chip.

The invention claimed is:

1. An output-current detection IC chip for diode sensors, comprising:
   a common terminal connected to one ends of N diode sensors, wherein N is an integer of 2 or more;
   N input terminals connected to the other ends of the respective diode sensors;
   N+1 protection circuits connected to the N input terminals and the common terminal;
   a chopper circuit which switches the polarity of an output current of each diode sensor;
   an I-V conversion circuit which converts the output current from the chopper circuit into a voltage; and
   a current supplying unit which supplies a compensation current to an input of the I-V conversion circuit.

2. The output-current detection IC chip for the diode sensors according to claim 1, wherein the common terminal is connected to anodes of the N diode sensors, wherein N is an integer of 2 or more, and
   wherein the N input terminals are connected to cathodes of the respective diode sensors.

3. The output-current detection IC chip for the diode sensors according to claim 1, wherein the common terminal is connected to the cathodes of the N diode sensors, wherein N is an integer of 2 or more, and
   wherein the N input terminals are connected to the anodes of the respective diode sensors.

4. The output-current detection IC chip for the diode sensors according to claim 1, wherein the current supplying unit supplies the compensation current to the input of the I-V conversion circuit according to switching of the chopper circuit.

5. The output-current detection IC chip for the diode sensors according to claim 1, wherein the current supplying unit is a dummy protection circuit.

6. The output-current detection IC chip for the diode sensors according to claim 5, further including a switch which switches whether or not to connect the dummy protection circuit to the input of the I-V conversion circuit according to the switching of the chopper circuit.

7. The output-current detection IC chip for the diode sensors according to claim 6, wherein the switch switches whether or not to connect the dummy protection circuit to the input of the I-V conversion circuit such that the number at which the dummy protection circuit is electrically connected to the input of the I-V conversion circuit becomes the same number before and after the switching of the polarity of each output current.

8. The output-current detection IC chip for the diode sensors according to claim 5, further including switches which switch whether or not to connect the dummy protection circuit to the input terminals according to the switching of the chopper circuit.

9. The output-current detection IC chip for the diode sensors according to claim 5, wherein the dummy protection circuit is arranged adjacent to the protection circuits.

10. The output-current detection IC chip for the diode sensors according to claim 1, which detects the output current of each diode sensor in a time division manner, and switches the polarity of the output current to detect same upon detection of the output current of each diode sensor.

11. The output-current detection IC chip for the diode sensors according to claim 1, wherein the chopper circuit has a first chopper switch unit connected to a first input terminal of a first diode sensor, a second chopper switch unit connected to a second input terminal connected to a second diode sensor, and a third chopper switch unit connected to the common terminal,
    wherein the first chopper switch unit and the third chopper switch unit switch the polarity of an output current of the first diode sensor, and
    wherein the second chopper switch unit and the third chopper switch unit switch the polarity of an output current of the second diode sensor.

12. The output-current detection IC chip for the diode sensors according to claim 1, wherein the common terminal is connected to a connection portion where the anodes of the respective diode sensors are connected to each other, or a connection portion where the cathodes of the respective diode sensors are connected to each other.

13. A diode sensor device comprising an output-current detection IC chip for diode sensors according to claim 1, and a sensor unit having N diode sensors, wherein N is an integer of 2 or more.

14. The diode sensor device according to claim 13, wherein the diode sensor is an infrared sensor.

* * * * *